United States Patent
Oh et al.

(10) Patent No.: US 10,573,682 B2
(45) Date of Patent: Feb. 25, 2020

(54) PIXEL ARRAY INCLUDED IN IMAGE SENSOR AND IMAGE SENSOR INCLUDING THE SAME

(71) Applicant: SAMSUNG ELECTRONICS CO., LTD., Suwon-si, Gyeonggi-Do (KR)

(72) Inventors: Young-Sun Oh, Hwaseong-si (KR); Yi-Tae Kim, Hwaseong-si (KR); Yu-Jung Choi, Yongin-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/175,097

(22) Filed: Oct. 30, 2018

(65) Prior Publication Data
US 2019/0221600 A1    Jul. 18, 2019

(30) Foreign Application Priority Data
Jan. 12, 2018 (KR) .......................... 10-2018-0004297

(51) Int. Cl.
| | | |
|---|---|---|
| *H04N 3/14* | (2006.01) | |
| *H04N 5/335* | (2011.01) | |
| *H01L 27/146* | (2006.01) | |
| *H04N 5/357* | (2011.01) | |

(52) U.S. Cl.
CPC .. *H01L 27/14641* (2013.01); *H01L 27/14603* (2013.01); *H04N 5/357* (2013.01)

(58) Field of Classification Search
CPC .... H04N 5/374; H04N 5/3741; H04N 5/3742; H04N 5/378; H01L 27/14641; H01L 27/14603; H01L 27/14612; H01L 27/1463; H01L 27/14636; H01L 27/14643
See application file for complete search history.

(56) References Cited

U.S. PATENT DOCUMENTS

| | | | |
|---|---|---|---|
| 7,525,077 B2 | 4/2009 | Kim et al. | |
| 8,378,401 B2 * | 2/2013 | Mori | ................ H01L 27/14609 257/292 |
| 8,969,775 B2 | 3/2015 | Chen et al. | |
| 9,467,637 B2 | 10/2016 | Lin et al. | |
| 9,712,798 B2 | 7/2017 | Hata | |
| 9,774,801 B2 | 9/2017 | Hseih et al. | |
| 10,096,632 B2 | 10/2018 | Oh et al. | |
| 2008/0012973 A1 | 1/2008 | Park et al. | |

(Continued)

*Primary Examiner* — Kelly L Jerabek
(74) *Attorney, Agent, or Firm* — F. Chau & Associates, LLC

(57) ABSTRACT

A pixel array in an image sensor includes a first pixel group. The first pixel group includes unit pixels that include photoelectric conversion units and a first signal generation unit shared by the photoelectric conversion units. The first signal generation unit includes transfer transistors connected to the photoelectric conversion units, respectively, a first floating diffusion node connected to the transfer transistors, a plurality of driving transistors connected to the first floating diffusion node and connected in parallel with one another, and a plurality of selection transistors connected in parallel between a first output terminal and the plurality of driving transistors. The first output terminal outputs pixel signals that correspond to photo charges collected by the photoelectric conversion units, respectively. A number of the plurality of selection transistors is equal to a number of the plurality of driving transistors.

20 Claims, 14 Drawing Sheets

(56) References Cited

U.S. PATENT DOCUMENTS

| | | |
|---|---|---|
| 2013/0256509 A1 | 10/2013 | Yang et al. |
| 2013/0321685 A1* | 12/2013 | Ahn ................. H04N 5/374 |
| | | 348/308 |
| 2016/0065875 A1* | 3/2016 | Wakano ........... H01L 27/14609 |
| | | 348/308 |
| 2016/0219238 A1* | 7/2016 | Tsuboi ............... H04N 5/37457 |
| 2016/0273961 A1 | 9/2016 | Kim |
| 2017/0236858 A1 | 8/2017 | Oh et al. |
| 2018/0182795 A1* | 6/2018 | Kim ................ H01L 27/14614 |
| 2019/0237496 A1* | 8/2019 | Kwag ............. H01L 27/14614 |

\* cited by examiner

PIXEL ARRAY INCLUDED IN IMAGE SENSOR AND IMAGE SENSOR INCLUDING THE SAME

CROSS-REFERENCE TO RELATED APPLICATION

This application claims priority under 35 U.S.C. § 119 to Korean Patent Application No. 10-2018-0004297, filed on Jan. 12, 2018 in the Korean Intellectual Property Office (KIPO), the disclosure of which is incorporated by reference herein in its entirety.

TECHNICAL FIELD

Exemplary embodiments of the inventive concept relate generally to image sensors, and more particularly, to pixel arrays included in image sensors and the image sensors including the pixel arrays.

DISCUSSION OF RELATED ART

An image sensor is a semiconductor device configured to convert an externally incident optical signal into an electrical signal which can be used to derive image information corresponding to the optical signal. A unit pixel of the image sensor includes a photoelectric conversion unit for converting the incident optical signal into the electrical signal and a signal generation unit for generating an image signal based on the electrical signal. Shared pixel structures in which one signal generation unit is shared by a plurality of photoelectric conversion units may reduce an area of the signal generation unit, increase an area of the photoelectric conversion unit, and thus improve an operating speed and/or noise characteristic of the image sensor.

SUMMARY

According to an exemplary embodiment of the inventive concept, a pixel array included in an image sensor includes a first pixel group. The first pixel group includes first, second, third, and fourth unit pixels that include first, second, third, and fourth photoelectric conversion units, respectively, and a first signal generation unit shared by the first, second, third, and fourth photoelectric conversion units. The first signal generation unit includes first, second, third, and fourth transfer transistors connected to the first, second, third, and fourth photoelectric conversion units, respectively, a first floating diffusion node connected to the first, second, third, and fourth transfer transistors, a plurality of driving transistors connected to the first floating diffusion node and connected in parallel with one another, and a plurality of selection transistors connected in parallel between a first output terminal and the plurality of driving transistors. The first output terminal outputs first, second, third, and fourth pixel signals that correspond to first, second, third, and fourth photo charges, respectively, collected by the first, second, third, and fourth photoelectric conversion units, respectively. A number of the plurality of selection transistors is equal to a number of the plurality of driving transistors.

According to an exemplary embodiment of the inventive concept, a pixel array included in an image sensor includes a first pixel group. The first pixel group includes first and second unit pixels that include first and second photoelectric conversion units, respectively, and a first signal generation unit shared by the first and second photoelectric conversion units. The first signal generation unit includes first and second transfer transistors connected to the first and second photoelectric conversion units, respectively, a first floating diffusion node connected to the first and second transfer transistors, a plurality of driving transistors connected to the first floating diffusion node and connected in parallel with one another, and a plurality of selection transistors connected in parallel between a first output terminal and the plurality of driving transistors. The first output terminal outputs first and second pixel signals that correspond to first and second photo charges, respectively, collected by the first and second photoelectric conversion units, respectively. A number of the plurality of selection transistors is equal to a number of the plurality of driving transistors.

According to an exemplary embodiment of the inventive concept, an image sensor includes a pixel array and a signal processing unit. The pixel array generates a plurality of pixel signals in response to incident light. The signal processing unit generates image data in response to the plurality of pixel signals. The pixel array includes a first pixel group. The first pixel group includes a plurality of unit pixels that include a plurality of photoelectric conversion units and a first signal generation unit shared by the plurality of photoelectric conversion units. The first signal generation unit includes a plurality of transfer transistors connected to the plurality of photoelectric conversion units, respectively, a first floating diffusion node connected to the plurality of transfer transistors, a plurality of driving transistors connected to the first floating diffusion node and connected in parallel with one another, and a plurality of selection transistors connected in parallel between a first output terminal and the plurality of driving transistors. The first output terminal outputs at least one of the plurality of pixel signals. A number of the plurality of selection transistors is equal to a number of the plurality of driving transistors.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1A:
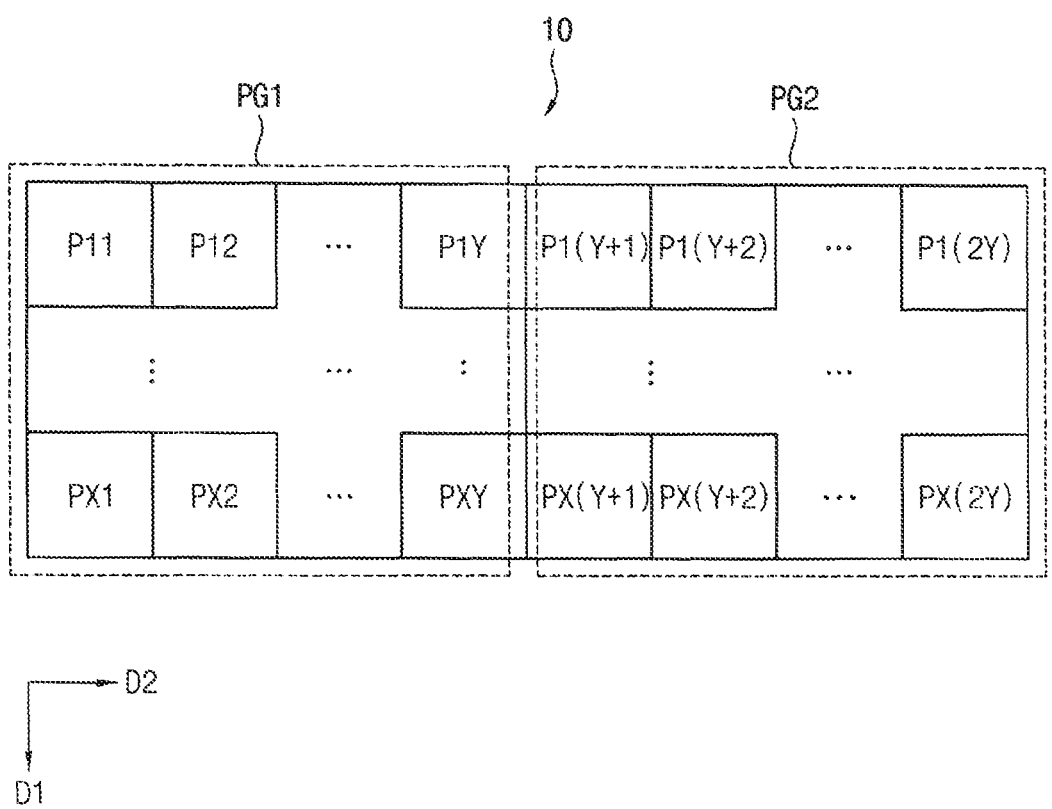
FIG. 1A is a plan view illustrating a pixel array in an image sensor according to an exemplary embodiment of the inventive concept.

Exemplary embodiments of the inventive concept provides a pixel array in an image sensor with a shared pixel structure having relatively improved characteristics.

Exemplary embodiments of the inventive concept also provide an image sensor including the pixel array.

Exemplary embodiments of the inventive concept will be described more fully hereinafter with reference to the accompanying drawings. Like reference numerals may refer to like elements throughout this application.

FIG. 1A is a plan view illustrating a pixel array in an image sensor according to an exemplary embodiment of the inventive concept.

Referring to FIG. 1A, a pixel array 10 included in an image sensor includes a first pixel group PG1 and a second pixel group PG2.

The first pixel group PG1 includes a plurality of unit pixels P11, P12, . . . , P1Y, . . . , PX1, PX2, . . . , PXY that are arranged in a matrix formation. The plurality of unit pixels P11 to P1Y and PX1 to PXY may include X*Y unit pixels, where each of X and Y is a natural number. For example, X unit pixels may be arranged in a first direction D1, and Y unit pixels may be arranged in a second direction D2 crossing (e.g., perpendicular to) the first direction D1.

The second pixel group PG2 is disposed adjacent to the first pixel group PG1. The second pixel group PG2 includes a plurality of unit pixels P1(Y+1), P1(Y+2), . . . , P1(2Y), . . . , PX(Y+1), PX(Y+2), . . . , PX(2Y) that are arranged in a matrix formation. The second pixel group PG2 may have a structure substantially the same as that of the first pixel group PG1.

As will be described with reference to FIG. 1B, one pixel group may be implemented to include or share one signal generation unit (e.g., one floating diffusion node).

Although FIG. 1A illustrates an example where the pixel array 10 includes two pixel groups PG1 and PG2 arranged along the second direction D2, the inventive concept is not limited thereto. For example, the pixel array 10 may include two pixel groups arranged along the first direction D1. As another example, the pixel array 10 may include any number of pixel groups arranged along the first and second directions D1 and D2.

Figure 1B:
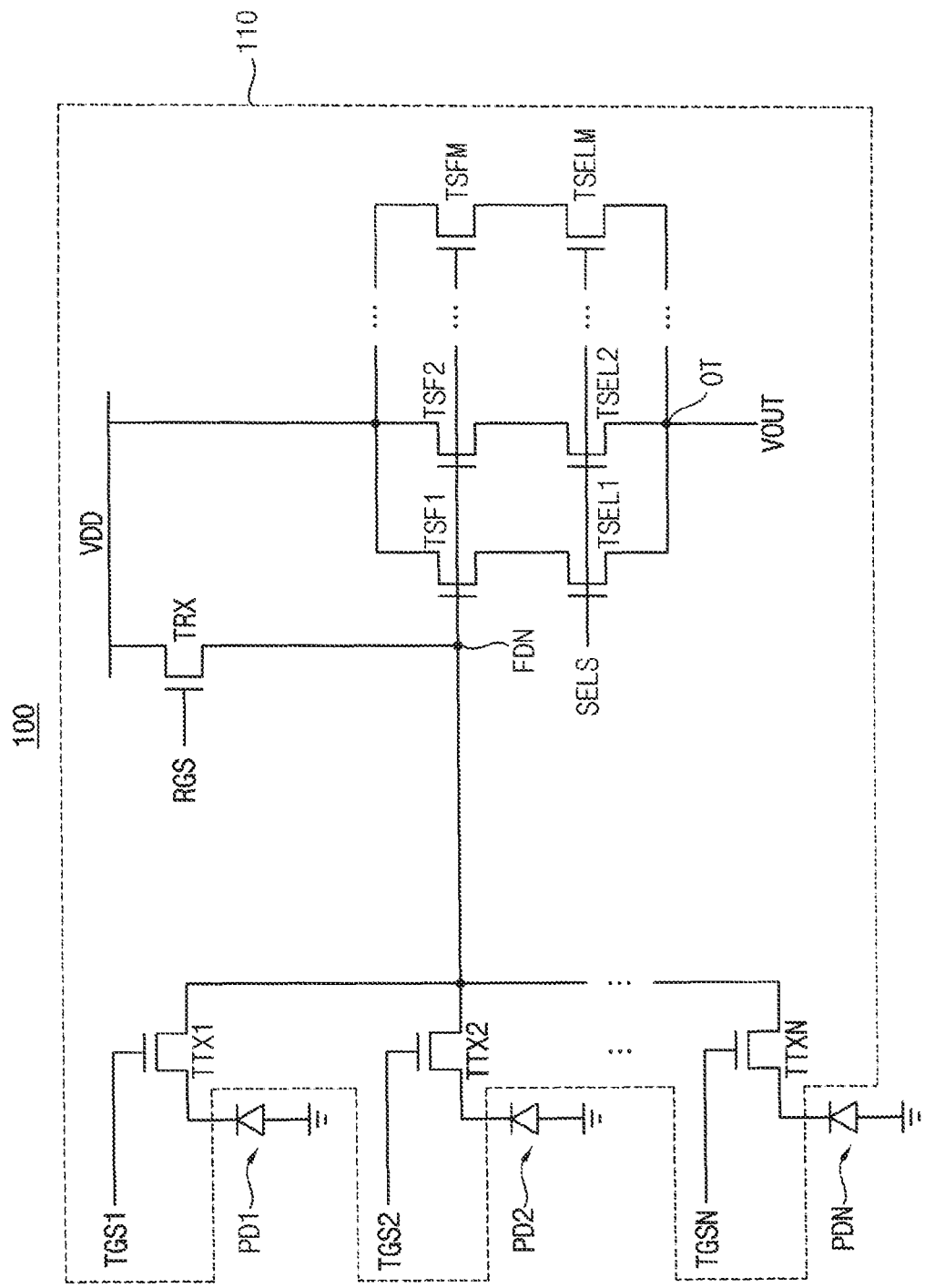
FIG. 1B is a circuit diagram illustrating a pixel group that is included in a pixel array according to an exemplary embodiment of the inventive concept.

FIG. 1B is a circuit diagram illustrating a pixel group that is included in a pixel array according to an exemplary embodiment of the inventive concept.

Referring to FIG. 1B, a pixel group 100 includes a plurality of photoelectric conversion units PD1, PD2, . . . , PDN and a signal generation unit 110.

Each of the plurality of photoelectric conversion units PD1 to PDN performs a photoelectric conversion operation. For example, each of the plurality of photoelectric conversion units PD1 to PDN may convert incident light into photo charges during an integration mode (or a light collection mode). If an image sensor including the pixel group 100 is a complementary metal oxide semiconductor (CMOS) image sensor, image information on an object to be captured may be obtained by collecting charge carriers (e.g., electron-hole pairs) in each of the plurality of photoelectric conversion units PD1 to PDN proportional to an intensity of the incident light through an open shutter of the CMOS image sensor during the integration mode. For example, the plurality of photoelectric conversion units PD1 to PDN may include first through N-th photoelectric conversion units, where N is a natural number greater than or equal to two.

The signal generation unit 110 is shared by the plurality of photoelectric conversion units PD1 to PDN. One photoelectric conversion unit and the signal generation unit 110 may form one unit pixel. For example, the first photoelectric conversion unit PD1 and the signal generation unit 110 may form a first unit pixel, and the N-th photoelectric conversion unit PDN and the signal generation unit 110 may form an N-th unit pixel. In other words, the number of a plurality of unit pixels in the pixel group 100 may be equal to the number of the plurality of photoelectric conversion units PD1 to PDN in the pixel group 100.

The signal generation unit 110 generates an electric signal (e.g., a plurality of pixel signals VOUT) based on the photo charges collected or generated by the photoelectric conversion operation during a readout mode. If the image sensor including the pixel group 100 is the CMOS image sensor, the shutter may be closed, and the plurality of pixel signals VOUT may be generated based on the image information in a form of the charge carriers during the readout mode after the integration mode.

The signal generation unit 110 includes a plurality of transfer transistors TTX1, TTX2, . . . , TTXN, a floating diffusion node FDN, a plurality of driving transistors (or source follower transistors) TSF1, TSF2, . . . , TSFM, and a plurality of selection transistors TSEL1, TSEL2, . . . , TSELM. The signal generation unit 110 may further include a reset transistor TRX. As illustrated in FIG. 1B, a structure of a unit pixel including the reset transistor TRX may be referred to as four-transistor structure. In an exemplary embodiment of the inventive concept, a structure of a unit pixel where the reset transistor TRX is omitted may be referred to as three-transistor structure.

Each of the plurality of transfer transistors TTX1 to TTXN is connected between a respective one of the plurality of photoelectric conversion units PD1 to PDN and the floating diffusion node FDN, and includes a gate electrode receiving a respective one of a plurality of transfer signals TGS1, TGS2, . . . , TGSN. For example, the first transfer transistor TTX1 may be connected between the first photoelectric conversion unit PD1 and the floating diffusion node FDN, and may have a gate electrode receiving the first transfer signal TGS1. The number of the plurality of transfer transistors TTX1 to TTXN may be equal to the number of the plurality of photoelectric conversion units PD1 to PDN. For example, the plurality of transfer transistors TTX1 to TTXN may include first through N-th transfer transistors.

The reset transistor TRX may be connected between a power supply voltage VDD and the floating diffusion node FDN, and may include a gate electrode receiving a reset signal RGS.

The plurality of driving transistors TSF1 to TSFM are connected in common to the power supply voltage VDD, and are connected in parallel with one another. Gate electrodes of the plurality of driving transistors TSF1 to TSFM are connected in common to the floating diffusion node FDN. The plurality of selection transistors TSEL1 to TSELM are connected in common to an output terminal OT that outputs the plurality of pixel signals VOUT, and are connected in parallel with one another. Gate electrodes of the plurality of selection transistors TSEL1 to TSELM receive a selection signal SELS in common. The number of the plurality of selection transistors TSEL1 to TSELM is equal to the number of the plurality of driving transistors TSF1 to TSFM. For example, the plurality of driving transistors TSF1 to TSFM may include first through M-th driving transistors, and the plurality of selection transistors TSEL1 to TSELM may include first through M-th selection transistors, where M is a natural number greater than or equal to two.

One of the plurality of driving transistors TSF1 to TSFM and a respective one of the plurality of selection transistors TSEL1 to TSELM may be connected in series between the power supply voltage VDD and the output terminal OT. For example, the first driving transistor TSF1 and the first selection transistor TSEL1 may be connected in series between the power supply voltage VDD and the output terminal OT. A first transistor group including the transistors TSF1 and TSEL1 connected in series, a second transistor group including the transistors TSF2 and TSEL2 connected in series, and an M-th transistor group including the transistors TSFM and TSELM connected in series may be connected in parallel between the power supply voltage VDD and the output terminal OT.

In exemplary embodiments of the inventive concept, as will be described with reference to FIGS. 2 through 8, the number of the plurality of driving transistors TSF1 to TSFM and the number of the plurality of selection transistors TSEL1 to TSELM in the signal generation unit 110 may be less than the number of the plurality of photoelectric conversion units PD1 to PDN and the number of unit pixels in the pixel group 100 (e.g., M<N). In exemplary embodiments of the inventive concept, as will be described with reference to FIGS. 9 through 11, the number of the plurality of driving transistors TSF1 to TSFM and the number of the plurality of selection transistors TSEL1 to TSELM in the signal generation unit 110 may be equal to the number of the plurality of photoelectric conversion units PD1 to PDN and the number of unit pixels in the pixel group 100 (e.g., M=N).

The plurality of pixel signals VOUT may include first through N-th pixel signals. The first pixel signal may correspond to first photo charges collected or generated by the first photoelectric conversion unit PD1, and the N-th pixel signal may correspond to N-th photo charges collected or generated by the N-th photoelectric conversion unit PDN.

Hereinafter, an operation of generating the first pixel signal will be described in detail. When an external light is incident onto the first photoelectric conversion unit PD1 during the integration mode, the first photo charges are collected or generated in proportion to the amount of the incident light. During the readout mode after the integration mode, the selection signal SELS is activated, and the signal generation unit 110, connected to the first photoelectric conversion unit PD1, is selected in response to the selection signal SEL. After that, the reset signal RGS is activated, the reset transistor TRX is turned on in response to the reset signal RGS, and an electric potential of the floating diffusion node FDN, which is a sensing node, is reset to the power supply voltage VDD. When the reset signal RGS is deactivated and the reset operation is completed, the first pixel signal has a reset level corresponding to a reset state of the floating diffusion node FDN. After that, the first transfer signal TGS1 is activated, the first transfer transistor TTX1 is turned on in response to the first transfer signal TGS1, and the first photo charges accumulated in the first photoelectric conversion unit PD1 are transferred to the floating diffusion node FDN via the first transfer transistor TTX1. When the first transfer signal TGS1 is deactivated and the charge transfer operation is completed, the first pixel signal has an image level corresponding to the incident light (e.g., corresponding to the first photo charges).

An operation of generating the remainder of the plurality of pixel signals VOUT other than the first pixel signal may be substantially the same as the operation of generating the first pixel signal, and the signal generation unit 110 may generate and output the plurality of pixel signals VOUT by performing such operations multiple times. In addition, all of the plurality of driving transistors TSF1 to TSFM and the plurality of selection transistors TSEL1 to TSELM may be turned on to output one pixel signal.

The pixel array including the pixel group 100 according to exemplary embodiments of the inventive concept may be implemented with a signal generation unit (SGU) shared structure in which one signal generation unit 110 is shared by the plurality of photoelectric conversion units PD1 to PDN. In addition, the signal generation unit 110 may be implemented with a multi driving transistor (TSF) and selection transistor (TSEL) structure in which the signal generation unit 110 includes the plurality of driving transistors TSF1 to TSFM connected in parallel with one another and the plurality of selection transistors TSEL1 to TSELM connected in parallel with one another.

By including the plurality of driving transistors TSF1 to TSFM connected in parallel with one another, a total area (e.g., a W/L ratio) of the driving transistors TSF1 to TSFM may increase, a total gain (e.g., Gm) of the driving transistors TSF1 to TSFM may increase, and a total resistance of the driving transistors TSF1 to TSFM may decrease. Thus, dark random noise (or dark temporal noise), random telescopic signal (RTS) noise, thermal noise, etc. may be reduced, and an operating speed of the unit pixel may increase. In addition, by including the plurality of selection transistors TSEL1 to TSELM connected in parallel with one another, a total area (e.g., W/L ratio) of the selection transistors TSEL1 to TSELM may increase, and a total resistance of the selection transistors TSEL1 to TSELM may decrease. Further, one driving transistor and one selection transistor may be connected to each other by one line or wiring (e.g., with a relatively simple structure), and thus degradation due to fixed pattern noise (FPN) may be prevented.

Figure 2:
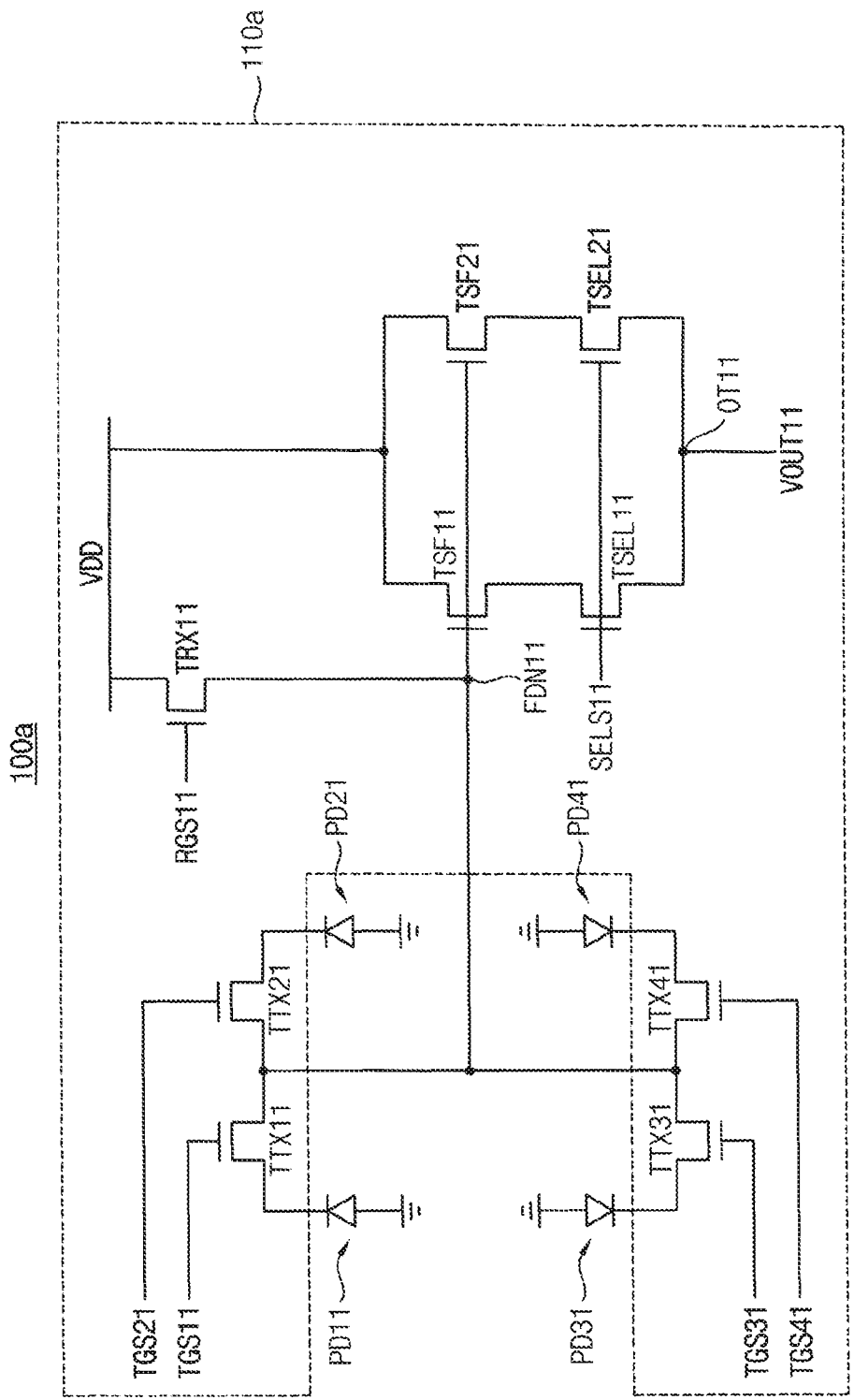
FIG. 2 is a circuit diagram illustrating the pixel group of FIG. 1B according to an exemplary embodiment of the inventive concept.

FIG. 2 is a circuit diagram illustrating the pixel group of FIG. 1B. Elements already described with reference to FIG. 1B are omitted.

Referring to FIG. 2, a first pixel group 100a that is included in a pixel array of an image sensor includes first, second, third, and fourth unit pixels.

The first, second, third, and fourth unit pixels in the first pixel group 100a include first, second, third, and fourth photoelectric conversion units PD11, PD21, PD31, and PD41, and a first signal generation unit 110a shared by the first, second, third, and fourth photoelectric conversion units PD11, PD21, PD31, and PD41.

The first signal generation unit 110a includes first, second, third, and fourth transfer transistors TTX11, TTX21, TTX31, and TTX41, a first floating diffusion node FDN11, first and second driving transistors TSF11 and TSF21, and first and second selection transistors TSEL11 and TSEL21. The first, second, third, and fourth transfer transistors TTX11, TTX21, TTX31, and TTX41 are connected to the first, second, third, and fourth photoelectric conversion units PD11, PD21, PD31, and PD41, respectively, and receive first, second, third, and fourth transfer signals TGS11, TGS21, TGS31, and TGS41, respectively. The first floating diffusion node FDN11 is connected to the first, second, third, and fourth transfer transistor TTX11, TTX21, TTX31, and TTX41. The first and second driving transistors TSF11 and TSF21 are connected to the first floating diffusion node FDN11, and are connected in parallel with each other. The first and second selection transistors TSEL11 and TSEL21 are connected in parallel between a first output terminal OT11 and the first and second driving transistors TSF11 and TSF21. The first signal generation unit 110a may further include a first reset transistor TRX11 that is connected to the first floating diffusion node FDN11.

The first and second driving transistors TSF11 and TSF21 may be connected in parallel with each other, and gate electrodes of the first and second driving transistors TSF11 and TSF21 may be connected in common to the first floating diffusion node FDN11. The first and second selection transistors TSEL11 and TSEL21 may be connected in parallel with each other, and gate electrodes of the first and second selection transistors TSEL11 and TSEL21 may receive a selection signal SELS11 in common. A gate electrode of the first reset transistor TRX11 may receive a reset signal RGS11. A plurality of pixel signals VOUT11 output from the first output terminal OT11 may include first, second, third, and fourth pixel signals that correspond to first, second, third, and fourth photo charges collected by the first, second, third, and fourth photoelectric conversion units PD11, PD21, PD31, and PD41, respectively.

The first pixel group 100a of FIG. 2 may be an example of the pixel group 100 of FIG. 1B, where N is 4 and M is 2.

Figure 3:
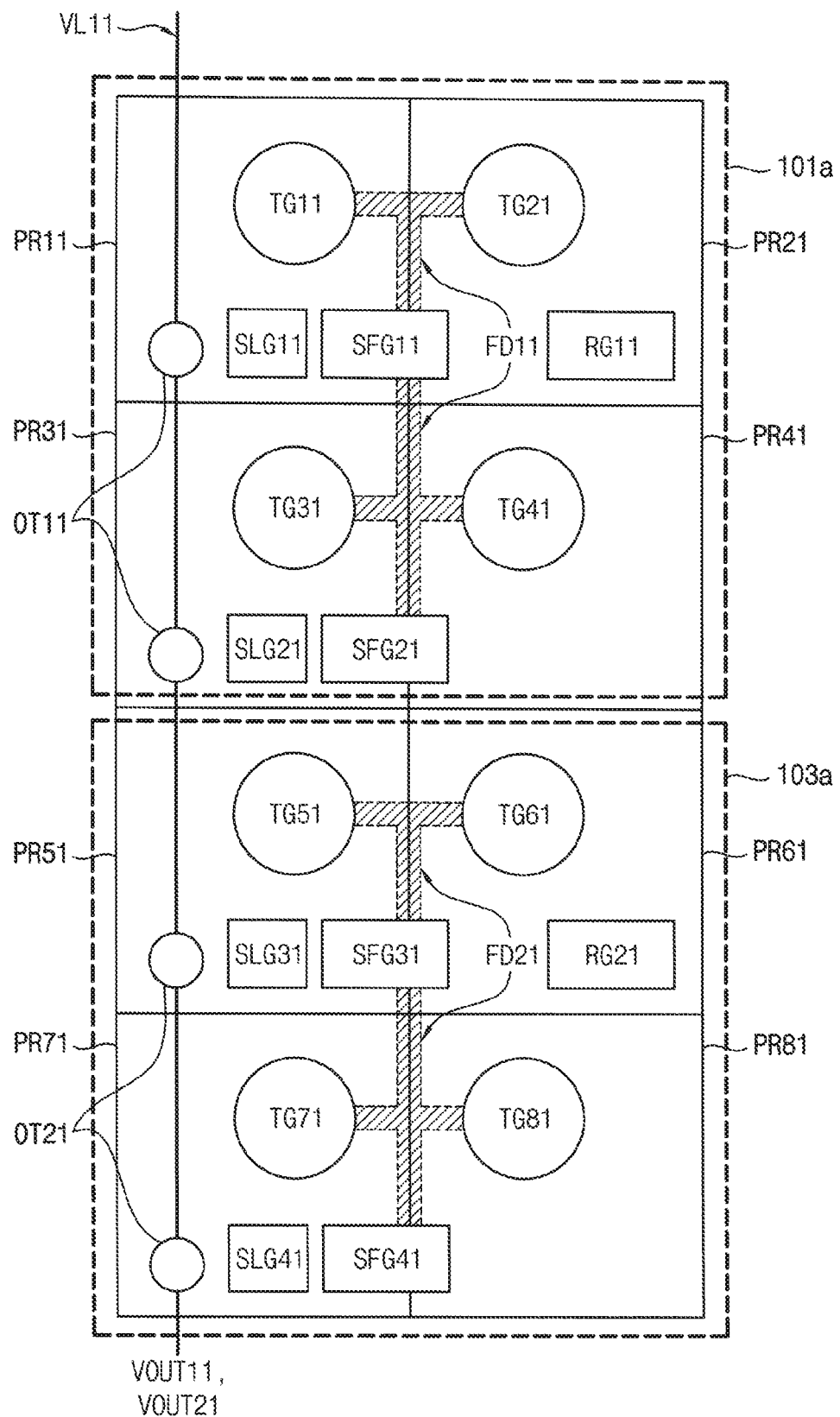
FIG. 3 is a plan view illustrating a layout arrangement of the pixel group of FIG. 2 according to an exemplary embodiment of the inventive concept.

FIG. 3 is a plan view illustrating a layout arrangement of the pixel group of FIG. 2 according to an exemplary embodiment of the inventive concept. FIG. 3 illustrates a top plan view of a substrate in which transistors included in a signal generation unit are in view of a first surface (e.g., a top surface) of the substrate.

Referring to FIG. 3, a pixel array in an image sensor includes a first pixel group 101a and a second pixel group 103a adjacent to the first pixel group 101a.

The first pixel group 101a includes first, second, third, and fourth unit pixels. The first, second, third, and fourth unit pixels in the first pixel group 101a may be substantially the same as the first, second, third, and fourth unit pixels in the first pixel group 100a of FIG. 2, respectively. The first, second, third, and fourth unit pixels in the first pixel group 101a may be arranged in a 2×2 matrix formation in a plan view.

For example, the first, second, third, and fourth unit pixels in the first pixel group 101a may be formed in first, second, third, and fourth pixel regions PR11, PR21, PR31, and PR41, respectively, arranged in a 2×2 matrix formation in a plan view. First, second, third, and fourth transfer gates TG11, TG21, TG31, and TG41, which correspond to the first, second, third, and fourth transfer transistors TTX11, TTX21, TTX31, and TTX41 in FIG. 2, may be formed on the first, second, third, and fourth pixel regions PR11, PR21, PR31, and PR41, respectively. A first floating diffusion region FD11, which corresponds to the first floating diffusion node FDN11 in FIG. 2, may be formed in the first, second, third, and fourth pixel regions PR11, PR21, PR31, and PR41 such that the first floating diffusion region FD11 partially overlaps all of the first, second, third, and fourth pixel regions PR11, PR21, PR31, and PR41.

Each of first and second driving gates SFG11 and SFG21, which correspond to the first and second driving transistors TSF11 and TSF21 in FIG. 2, may be formed on a respective two of the first, second, third, and fourth pixel regions PR11, PR21, PR31, and PR41 such that each of the first and second driving gates SFG11 and SFG21 partially overlaps the respective two of the first, second, third, and fourth pixel regions PR11, PR21, PR31, and PR41. Each of first and second selection gates SLG11 and SLG21, which correspond to the first and second selection transistors TSEL11 and TSEL21 in FIG. 2, may be formed on a respective one of the first and third pixel regions PR11 and PR31, and may be disposed adjacent to a respective one of the first and second driving gates SFG11 and SFG21. A first reset gate RG11, which corresponds to the first reset transistor TRX11 in FIG. 2, may be formed on the second pixel region PR21. As illustrated in FIG. 3, arrangements of the transfer gates TG11, TG21, TG31, and TG41 may be determined first, and arrangements of the other gates SFG11, SFG21, SLG11, SLG21 and RG11 may be determined to efficiently utilize the remaining areas of the pixel regions PR11, PR21, PR31, and PR41.

First, second, third, and fourth photoelectric conversion regions, which correspond to the first, second, third, and fourth photoelectric conversion units PD11, PD21, PD31, and PD41 in FIG. 2, may be formed in the first, second, third, and fourth pixel regions PR11, PR21, PR31, and PR41, respectively, and may be formed adjacent to a second surface (e.g., a bottom surface) of the substrate opposite to the first surface of the substrate. In this example, the image sensor may be a backside illuminated image sensor (BIS) that performs the photoelectric conversion operation in response to the incident light passing through the second surface of the substrate. In addition, although it appears as if the first floating diffusion region FD11 is cut by the first driving gate SFG11 in FIG. 3, the first floating diffusion region FD11 may be one integrated region formed under the first driving gate SFG11.

In exemplary embodiments of the inventive concept, the first and second driving gates SFG11 and SFG21 corresponding to the first and second driving transistors TSF11 and TSF21 in FIG. 2 and the first and second selection gates SLG11 and SLG21 corresponding to the first and second selection transistors TSEL11 and TSEL21 in FIG. 2 may be disposed as illustrated in FIG. 3, such that an output line VL11 connected to the first output terminal OT11 is formed in a straight line in a plan view.

The second pixel group 103a may include fifth, sixth, seventh, and eighth unit pixels, and may have a structure substantially the same as that of the first pixel group 101a.

For example, the fifth, sixth, seventh, and eighth unit pixels in the second pixel group 103a may include fifth, sixth, seventh, and eighth photoelectric conversion units and a second signal generation unit shared by the fifth, sixth, seventh, and eighth photoelectric conversion units. The fifth, sixth, seventh, and eighth unit pixels may be arranged in a 2×2 matrix formation in a plan view. The second signal generation unit may include fifth, sixth, seventh, and eighth transfer transistors, a second floating diffusion node, third, and fourth driving transistors, and third, and fourth selection transistors. The fifth, sixth, seventh, and eighth transfer transistors may be connected to the fifth, sixth, seventh, and eighth photoelectric conversion units, respectively. The second floating diffusion node may be connected to the fifth, sixth, seventh, and eighth transfer transistors. The third and fourth driving transistors may be connected to the second floating diffusion node, and may be connected in parallel with each other. The third and fourth selection transistors may be connected in parallel between a second output terminal OT21 and the third and fourth driving transistors. The second output terminal OT21 may be different from the first output terminal OT11. The second signal generation unit may further include a second reset transistor that is connected to the second floating diffusion node.

The fifth, sixth, seventh, and eighth unit pixels in the second pixel group 103a may be formed in fifth, sixth, seventh, and eighth pixel regions PR51, PR61, PR71, and PR81, respectively, arranged in a 2×2 matrix formation in a plan view. Arrangements of fifth, sixth, seventh, and eighth transfer gates TG51, TG61, TG71, and TG81 corresponding to the fifth, sixth, seventh, and eighth transfer transistors, a second floating diffusion region FD21 corresponding to the second floating diffusion node, third and fourth driving gates SFG31 and SFG41 corresponding to the third and fourth driving transistors, third and fourth selection transistors SLG31 and SLG41 corresponding to the third and fourth selection transistors, and a second reset gate RG21 corresponding to the second reset transistor may be substantially the same as arrangements of the first, second, third, and fourth transfer gates TG11, TG21, TG31, and TG41, the first floating diffusion region FD11, the first and second driving gates SFG11 and SFG21, the first and second selection gates SLG11 and SLG21, and the first reset gate RG11, respectively. Fifth, sixth, seventh, and eighth photoelectric conversion regions corresponding to the fifth, sixth, seventh, and eighth photoelectric conversion units may be formed in the fifth, sixth, seventh, and eighth pixel regions PR51, PR61, PR71, and PR81, respectively.

In exemplary embodiments of the inventive concept, the first, second, third, and fourth driving gates SFG11, SFG21, SFG31, and SFG41 corresponding to the first, second, third, and fourth driving transistors and the first, second, third, and fourth selection gates SLG11, SLG21, SLG31, and SLG41 corresponding to the first, second, third, and fourth selection transistors may be disposed as illustrated in FIG. 3 such that the output line VL11 connected to the first and second output terminals OT11 and OT21 is formed in a straight line in a plan view. The pixel signals VOUT11 may be output from the first, second, third, and fourth unit pixels via the first output terminal OT11 and the output line VL11, and pixel signals VOUT21 may be output from the fifth, sixth, seventh, and eighth unit pixels via the second output terminal OT21 and the output line VL11.

As illustrated in FIG. 3, the output line VL11 connected to the output terminals OT11 and OT21 of the first and second pixel groups 101a and 103a may be formed with a single straight line (e.g., a single vertical line). Thus, a configuration of the output line VL11 may not become more complex even if the number of the selection transistors increases, and RC delay may be reduced or prevented.

In exemplary embodiments of the inventive concept, the arrangements and shapes of the gates TG11, TG21, TG31, TG41, SFG11, SFG21, SLG11, SLG21, and RG11 may be changed. In exemplary embodiments of the inventive concept, unlike an example of FIG. 3, the gates SFG11, SFG21, SLG11, SLG21, and RG11 other than the transfer gates TG11, TG21, TG31, and TG41 may not be disposed on the pixel regions PR11, PR21, PR31, and PR41, but may be disposed on peripheral regions surrounding the pixel regions PR11, PR21, PR31, and PR41.

Figure 4:
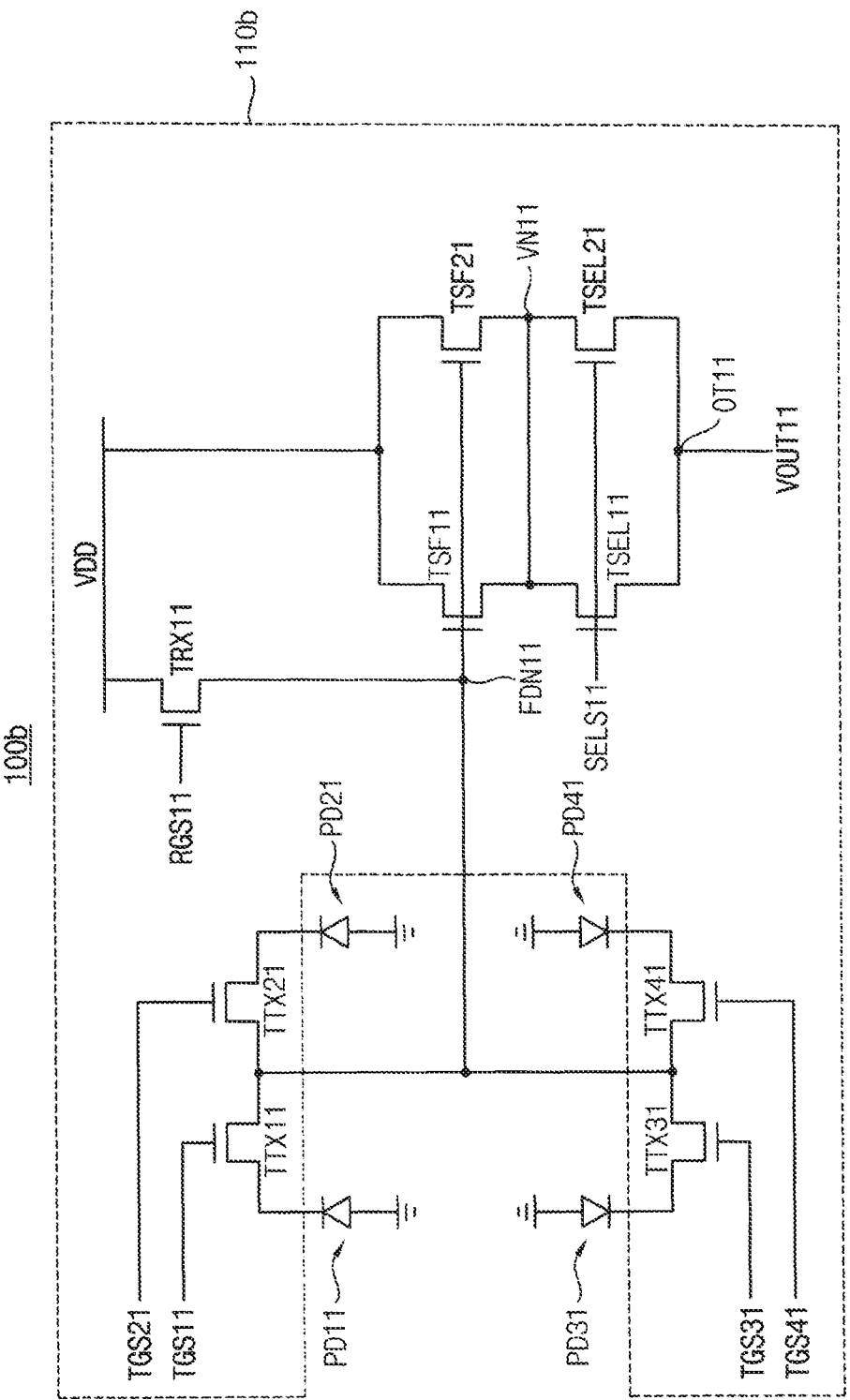
FIGS. 4 and 5 are circuit diagrams illustrating the pixel group of FIG. 1B according to exemplary embodiments of the inventive concept.
Figure 5:
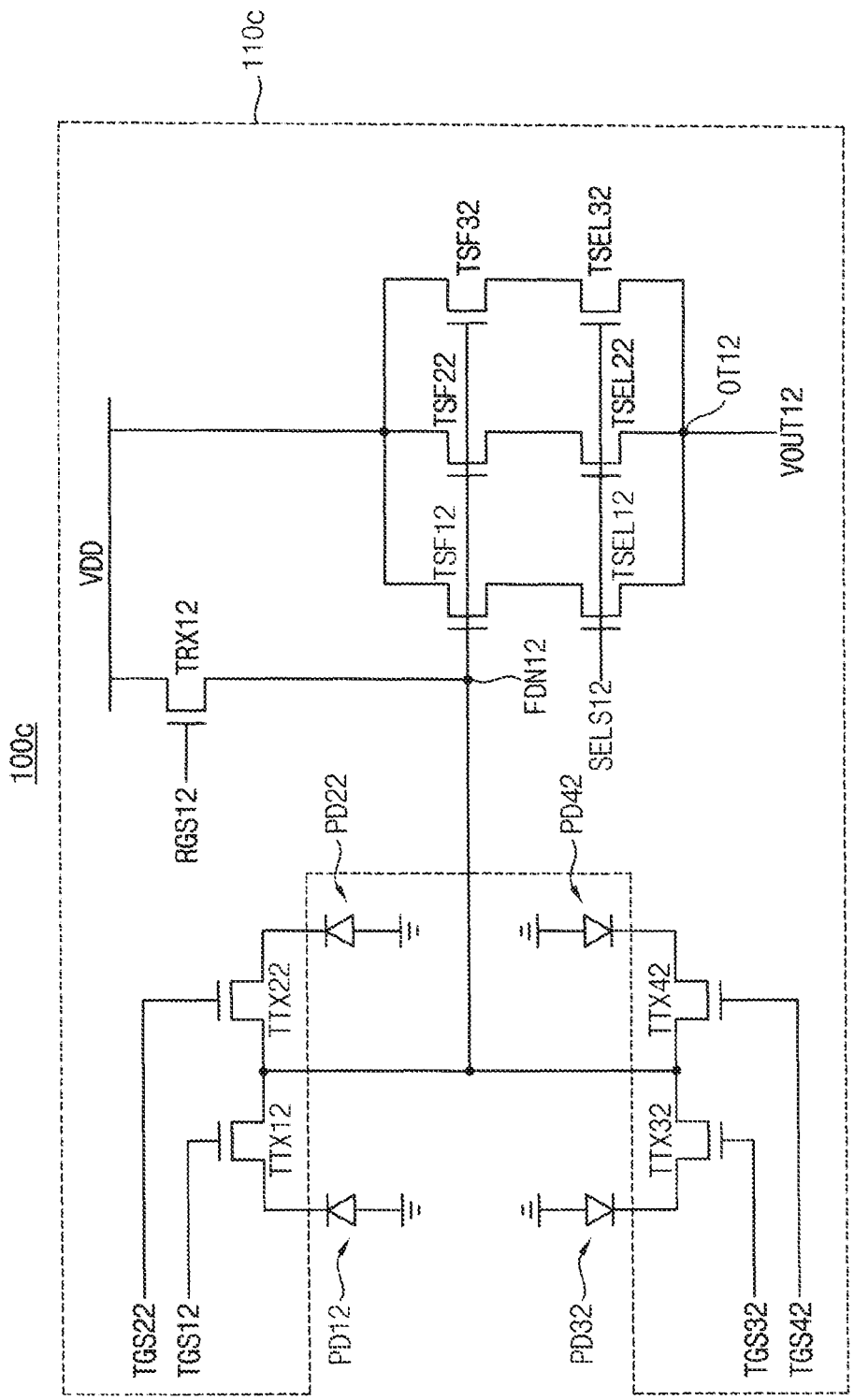

FIGS. 4 and 5 are circuit diagrams illustrating the pixel group of FIG. 1B according to exemplary embodiments of the inventive concept. Repeat descriptions are omitted.

Referring to FIG. 4, a first pixel group 100b that is included in a pixel array of an image sensor includes first, second, third, and fourth unit pixels. The first, second, third, and fourth unit pixels include first, second, third, and fourth photoelectric conversion units PD11, PD21, PD31, and PD41, and a first signal generation unit 110b shared by the first, second, third, and fourth photoelectric conversion units PD11, PD21, PD31, and PD41.

The first pixel group 100b of FIG. 4 may be substantially the same as the first pixel group 100a of FIG. 2, except that the first and second driving transistors TSF11 and TSF21 in FIG. 4 and the first and second selection transistors TSEL11 and TSEL21 in FIG. 4 are connected in common to a node VN11. Thus, repeat descriptions will be omitted.

In FIG. 2, a first transistor group including the transistors TSF11 and TSEL11 and a second transistor group including the transistors TSF21 and TSEL21 may be connected in parallel between the power supply voltage VDD and the first output terminal OT11. However, in FIG. 4, the first and second driving transistors TSF11 and TSF21 may be connected in parallel between the power supply voltage VDD and the node VN11, and the first and second selection transistors TSEL11 and TSEL21 may be connected in parallel between the node VN11 and the first output terminal OT11.

Referring to FIG. 5, a first pixel group 100c that is included in a pixel array of an image sensor includes first, second, third, and fourth unit pixels. The first, second, third, and fourth unit pixels include first, second, third, and fourth photoelectric conversion units PD12, PD22, PD32, and PD42, and a first signal generation unit 110c shared by the first, second, third, and fourth photoelectric conversion units PD12, PD22, PD32 and PD42.

The first signal generation unit 110c includes first, second, third, and fourth transfer transistors TTX12, TTX22, TTX32, and TTX42 receiving first, second, third, and fourth transfer signals TGS12, TGS22, TGS32, and TGS42, respectively, a first floating diffusion node FDN12, first, second, and third driving transistors TSF12, TSF22, and TSF32 connected in parallel with one another, and first, second, and third selection transistors TSEL12, TSEL22, and TSEL32 connected in parallel between a first output terminal OT12 and the first, second, and third driving transistors TSF12, TSF22, and TSF32. The first output terminal OT12 outputs a plurality of pixel signals VOUT12. The first signal generation unit 110c may further include a first reset transistor TRX12 receiving a reset signal RGS12.

The first pixel group 100c of FIG. 5 may be an example of the pixel group 100 of FIG. 1B, where N is 4 and M is 3.

Figure 6:
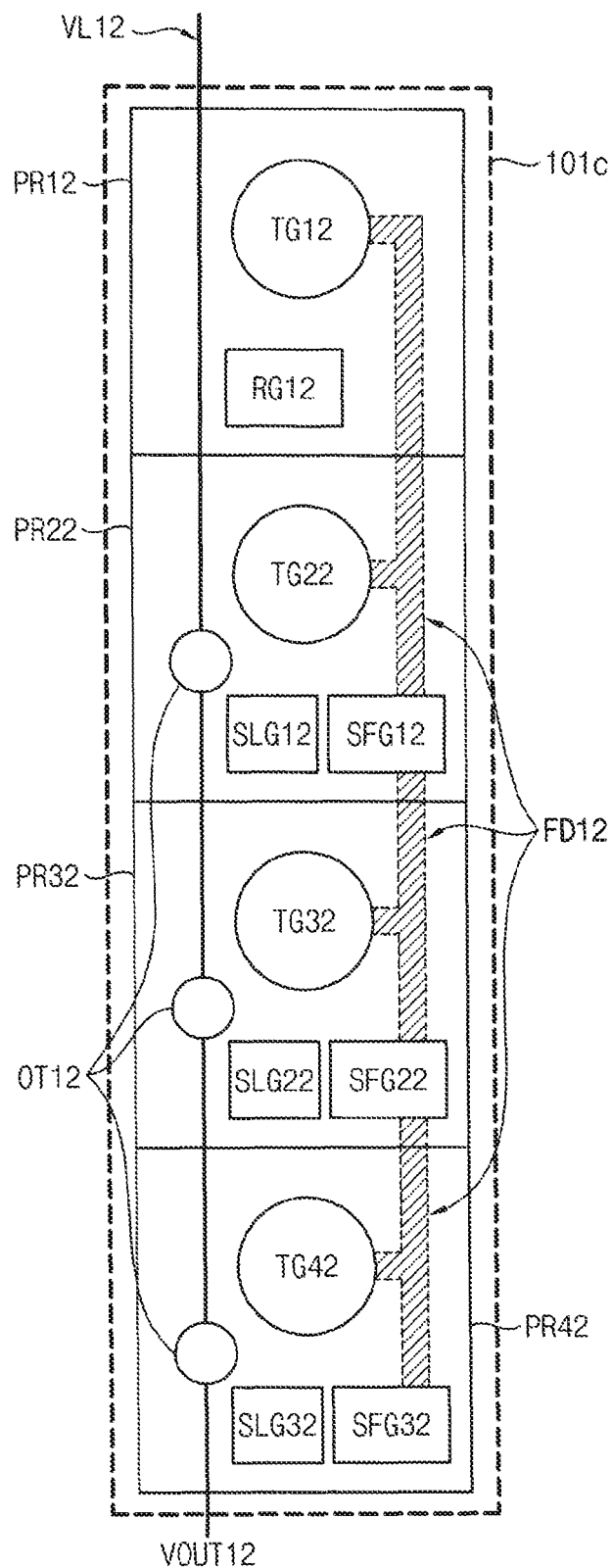
FIGS. 6 and 7 are plan views illustrating a layout arrangement of the pixel group of FIG. 5 according to exemplary embodiments of the inventive concept.
Figure 7:
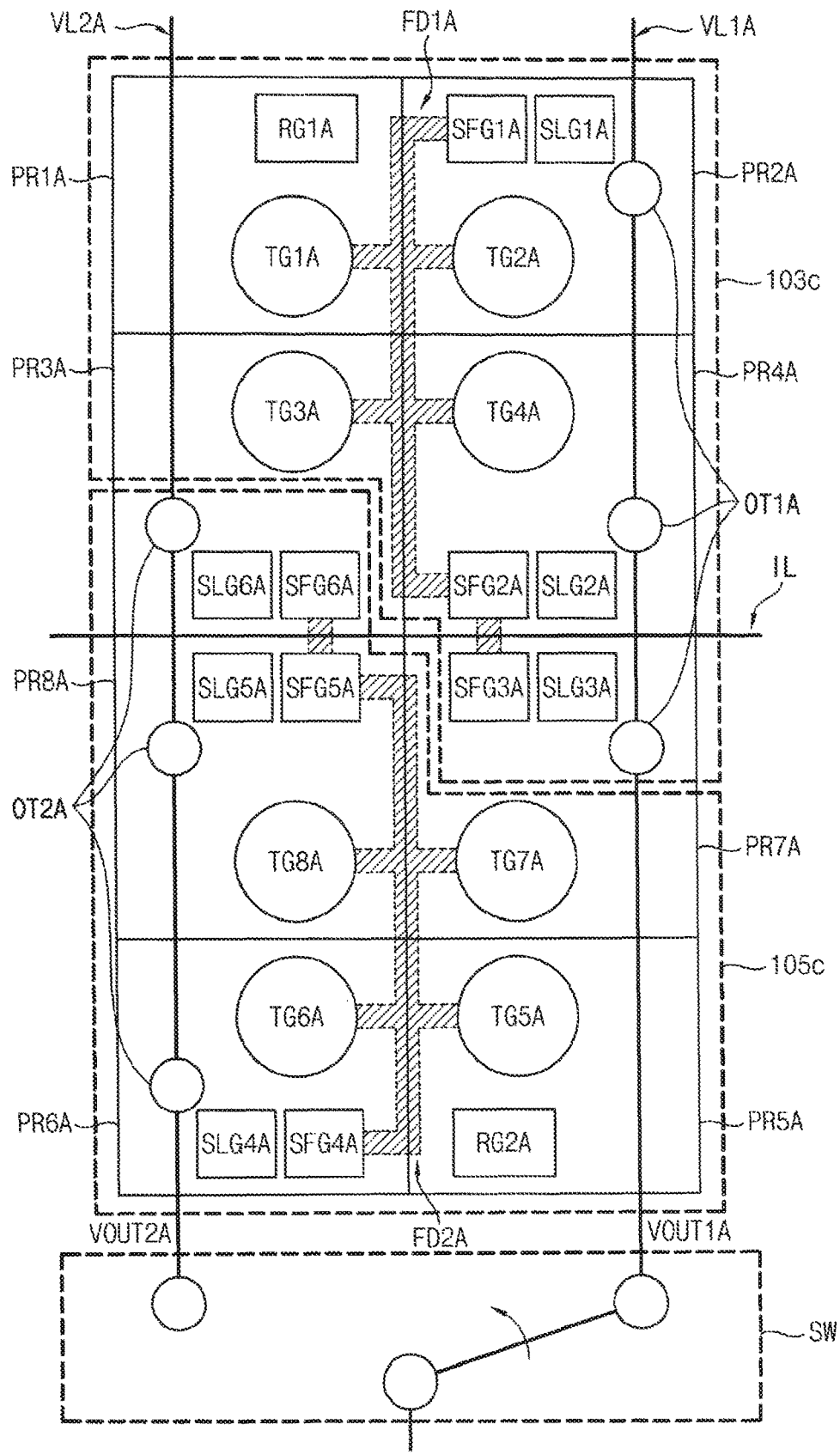

FIGS. 6 and 7 are plan views illustrating a layout arrangement of the pixel group of FIG. 5 according to exemplary embodiments of the inventive concept. FIGS. 6 and 7 illustrate top plan views of a substrate in which transistors included in a signal generation unit are in view of a first surface (e.g., a top surface) of the substrate. Repeat descriptions are omitted.

Referring to FIG. 6, a pixel array in an image sensor includes a first pixel group 101c.

The first pixel group 101c includes first, second, third, and fourth unit pixels. The first, second, third, and fourth unit pixels in the first pixel group 101c may be substantially the same as the first, second, third, and fourth unit pixels in the first pixel group 100c of FIG. 5, respectively. The first, second, third, and fourth unit pixels in the first pixel group 101c may be arranged in a 4×1 (or 1×4) matrix formation in a plan view.

For example, the first, second, third, and fourth unit pixels in the first pixel group 101c may be formed in first, second, third, and fourth pixel regions PR12, PR22, PR32, and PR42 arranged in a 4×1 matrix formation in a plan view, respectively. First, second, third, and fourth transfer gates TG12, TG22, TG32, and TG42, which correspond to the first, second, third, and fourth transfer transistors TTX12, TTX22, TTX32, and TTX42 in FIG. 5, may be formed on the first, second, third, and fourth pixel regions PR12, PR22, PR32, and PR42, respectively. A first floating diffusion region FD12, which corresponds to the first floating diffusion node FDN12 in FIG. 5, may be formed in the first, second, third, and fourth pixel regions PR12, PR22, PR32, and PR42 such that the first floating diffusion region FD12 partially overlaps all of the first, second, third, and fourth pixel regions PR12, PR22, PR32, and PR42.

A first reset gate RG12, which corresponds to the first reset transistor TRX12 in FIG. 5, may be formed on the first pixel region PR12. Each of first, second, and third driving gates SFG12, SFG22, and SFG32, which correspond to the first, second, and third driving transistors TSF12, TSF22, and TSF32 in FIG. 5, may be formed on a respective one of the second, third, and fourth pixel regions PR22, PR32 and PR42. Each of first, second, and third selection gates SLG12, SLG22, and SLG32, which correspond to the first, second and third selection transistors TSEL12, TSEL22 and TSEL32 in FIG. 5, may be formed on a respective one of the second, third, and fourth pixel regions PR22, PR32 and PR42, and may be disposed adjacent to a respective one of the first, second, and third driving gates SFG12, SFG22 and SFG32. As illustrated in FIG. 6, arrangements of the transfer gates TG12, TG22, TG32, and TG42 may be determined first, and arrangements of the other gates SFG12, SFG22, SFG32, SLG12, SLG22, SLG32, and RG11 may be determined to efficiently utilize the remaining areas of the pixel regions PR12, PR22, PR32, and PR42. For example, each of the reset gate RG12 and the driving gates SFG12, SFG22, and SFG32 may be formed on a respective one of the pixel regions PR12, PR22, PR32, and PR42.

First, second, third, and fourth photoelectric conversion regions, which correspond to the first, second, third, and fourth photoelectric conversion units PD12, PD22, PD32, and PD42 in FIG. 5, may be formed in the first, second, third, and fourth pixel regions PR12, PR22, PR32, and PR42, respectively.

In exemplary embodiments of the inventive concept, the first, second, and third driving gates SFG12, SFG22, and SFG32, corresponding to the first, second, and third driving transistors TSF12, TSF22, and TSF32 in FIG. 5, and the first, second, and third selection gates SLG12, SLG22, and SLG32, corresponding to the first, second and third selection transistors TSEL12, TSEL22, and TSEL32 in FIG. 5, may be disposed as illustrated in FIG. 6, such that an output line VL12 connected to the first output terminal OT12 is formed in a straight line in a plan view. The pixel signals VOUT12 may be output from the first, second, third, and fourth unit pixels via the first output terminal OT12 and the output line VL12.

Referring to FIG. 7, a pixel array in an image sensor includes a first pixel group 103c and a second pixel group 105c adjacent to the first pixel group 103c.

The first pixel group 103c includes first, second, third, and fourth unit pixels. The first, second, third, and fourth unit pixels in the first pixel group 103c may be substantially the same as the first, second, third, and fourth unit pixels in the first pixel group 100c of FIG. 5, respectively. The first, second, third, and fourth unit pixels in the first pixel group 103c may be arranged in a 2×2 matrix formation in a plan view.

The second pixel group 105c may include fifth, sixth, seventh, and eighth unit pixels, and may have a structure substantially the same as that of the first pixel group 103c. For example, the fifth, sixth, seventh, and eighth unit pixels in the second pixel group 105c may include fifth, sixth, seventh, and eighth photoelectric conversion units and a second signal generation unit shared by the fifth, sixth, seventh, and eighth photoelectric conversion units. The fifth, sixth, seventh, and eighth unit pixels may be arranged in a 2×2 matrix formation in a plan view. The second signal generation unit may include fifth, sixth, seventh, and eighth transfer transistors, a second floating diffusion node, fourth, fifth, and sixth driving transistors, and fourth, fifth, and sixth selection transistors. The fifth, sixth, seventh, and eighth transfer transistors may be connected to the fifth, sixth, seventh, and eighth photoelectric conversion units, respectively. The second floating diffusion node may be connected to the fifth, sixth, seventh, and eighth transfer transistors. The fourth, fifth, and sixth driving transistors may be connected to the second floating diffusion node, and may be connected in parallel with one another. The fourth, fifth, and sixth selection transistors may be connected in parallel between a second output terminal OT2A and the fourth, fifth, and sixth driving transistors. The second output terminal OT2A may be different from a first output terminal OT1A. The second signal generation unit may further include a second reset transistor that is connected to the second floating diffusion node.

In exemplary embodiments of the inventive concept, the first pixel group 103c and the second pixel group 105c may be formed with a mirror structure in which the first pixel group 103c and the second pixel group 105c are symmetric with respect to an imaginary line IL between the first pixel group 103c and the second pixel group 105c. For example, when the first pixel group 103c is rotated about 180 degrees with respect to the imaginary line IL, the rotated first pixel group 103c may have a structure substantially the same as that of the second pixel group 105c.

For example, the first, second, third, and fourth unit pixels in the first pixel group 103c may be formed in first, second, third, and fourth pixel regions PR1A, PR2A, PR3A, and PR4A arranged in a 2×2 matrix formation in a plan view, respectively. The fifth, sixth, seventh, and eighth unit pixels in the second pixel group 105c may be formed in fifth, sixth, seventh, and eighth pixel regions PR5A, PR6A, PR7A, and PR8A arranged in a 2×2 matrix formation in a plan view, respectively. First, second, third, and fourth transfer gates TG1A, TG2A, TG3A, and TG4A, which correspond to the first, second, third, and fourth transfer transistors TTX12, TTX22, TTX32, and TTX42 in FIG. 5, may be formed on the first, second, third, and fourth pixel regions PR1A, PR2A, PR3A, and PR4A, respectively. Fifth, sixth, seventh, and eighth transfer gates TG5A, TG6A, TG7A and TG8A, which correspond to the fifth, sixth, seventh, and eighth transfer transistors, may be formed on the fifth, sixth, seventh, and eighth pixel regions PR5A, PR6A, PR7A, and PR8A, respectively. A first floating diffusion region FD1A, which corresponds to the first floating diffusion node FDN12 in FIG. 5, may be formed in the first, second, third, and fourth pixel regions PR1A, PR2A, PR3A, and PR4A such that the first floating diffusion region FD1A partially overlaps all of the first, second, third, and fourth pixel regions PR1A, PR2A, PR3A, and PR4A. A second floating diffusion region FD2A, which corresponds to the second floating diffusion node, may be formed in the fifth, sixth, seventh, and eighth pixel regions PR5A, PR6A, PR7A, and PR8A such that the second floating diffusion region FD2A partially overlaps all of the fifth, sixth, seventh, and eighth pixel regions PR5A, PR6A, PR7A, and PR8A.

Each of a first reset gate RG1A, which corresponds to the first reset transistor TRX12 in FIG. 5, and a second reset gate RG2A, which corresponds to the second reset transistor, may be formed on a respective one of the first and fifth pixel regions PR1A and PR5A. Each of first, second, and third driving gates SFG1A, SFG2A, and SFG3A, which correspond to the first, second, and third driving transistors TSF12, TSF22, and TSF32 in FIG. 5, and fourth, fifth, and sixth driving gates SFG4A, SFG5A, and SFG6A, which correspond to the fourth, fifth, and sixth driving transistors, may be formed on a respective one of the second, third, fourth, sixth, seventh, and eighth pixel regions PR2A, PR3A, PR4A, PR6A, PR7A, and PR8A. Each of first, second, and third selection gates SLG1A, SLG2A, and SLG3A, which correspond to the first, second, and third selection transistors TSEL12, TSEL22, and TSEL32 in FIG. 5, and fourth, fifth, and sixth selection gates SLG4A, SLG5A, and SLG6A, which correspond to the fourth, fifth, and sixth selection transistors, may be formed on a respective one of the second, third, fourth, sixth, seventh, and eighth pixel regions PR2A, PR3A, PR4A, PR6A, PR7A, and PR8A, and may be disposed adjacent to a respective one of the first, second, third, fourth, fifth, and sixth driving gates SFG1A, SFG2A, SFG3A, SFG4A, SFG5A, and SFG6A. As illustrated in FIG. 7, arrangements of the transfer gates TG1A, TG2A, TG3A, TG4A, TG5A, TG6A, TG7A, and TG8A may be determined first, and arrangements of the other gates SFG1A, SFG2A, SFG3A, SFG4A, SFG5A, SFG6A, SLG1A, SLG2A, SLG3A, SLG4A, SLG5A, SLG6A, RG1A, and RG2A may be determined to efficiently utilize the remaining areas of the pixel regions PR1A, PR2A, PR3A, PR4A, PR5A, PR6A, PR7A, and PR8A. For example, each of the reset gates RG1A and RG2A and the driving gates SFG1A, SFG2A, SFG3A, SFG4A, SFG5A, and SFG6A may be formed on a respective one of the pixel regions PR1A, PR2A, PR3A, PR4A, PR5A, PR6A, PR7A, and PR8A.

First, second, third, and fourth photoelectric conversion regions, which correspond to the first, second, third, and fourth photoelectric conversion units PD12, PD22, PD32, and PD42 in FIG. 5, may be formed in the first, second, third, and fourth pixel regions PR1A, PR2A, PR3A, and PR4A, respectively. In addition, fifth, sixth, seventh, and eighth photoelectric conversion regions, which correspond to the fifth, sixth, seventh, and eighth photoelectric conversion units, may be formed in the fifth, sixth, seventh, and eighth pixel regions PR5A, PR6A, PR7A, and PR8A, respectively.

In exemplary embodiments of the inventive concept, the first, second, third, fourth, fifth, and sixth driving gates SFG1A, SFG2A, SFG3A, SFG4A, SFG5A, and SFG6A, corresponding to the first, second, third, fourth, fifth, and sixth driving transistors, and the first, second, third, fourth, fifth, and sixth selection gates SLG1A, SLG2A, SLG3A, SLG4A, SLG5A, and SLG6A, corresponding to the first, second, third, fourth, fifth, and sixth selection transistors, may be disposed as illustrated in FIG. 7, such that each of a first output line VL1A connected to the first output terminal OT1A and a second output line VL2A connected to the second output terminal OT2A is formed in a straight line in a plan view. For example, the first output line VL1A and the second output line VL2A may be substantially parallel with each other. The pixel signals VOUT1A may be output from the first, second, third, and fourth unit pixels via the first output terminal OT1A and the first output line VL1A, and pixel signals VOUT2A may be output from the fifth, sixth, seventh, and eighth unit pixels via the second output terminal OT2A and the second output line VL2A.

In exemplary embodiments of the inventive concept, the pixel array in the image sensor according to exemplary embodiments of the inventive concept may further include a switch SW for selecting one of the first output line VL1A and the second output line VL2A. For example, the switch SW may be disposed or located outside the pixel array.

In the readout mode, a toggling operation, which represents an operation of selecting only one of the first output line VL1A and the second output line VL2A, may be performed using the switch SW. When a unselected or unused output line (e.g., one of the first output line VL1A and the second output line VL2A) is disconnected based on the toggling operation in the readout mode, a total capacitance of the output terminal may be reduced, RC delay may be reduced, and thus the output signal may be efficiently stabilized or settled.

Figure 8:
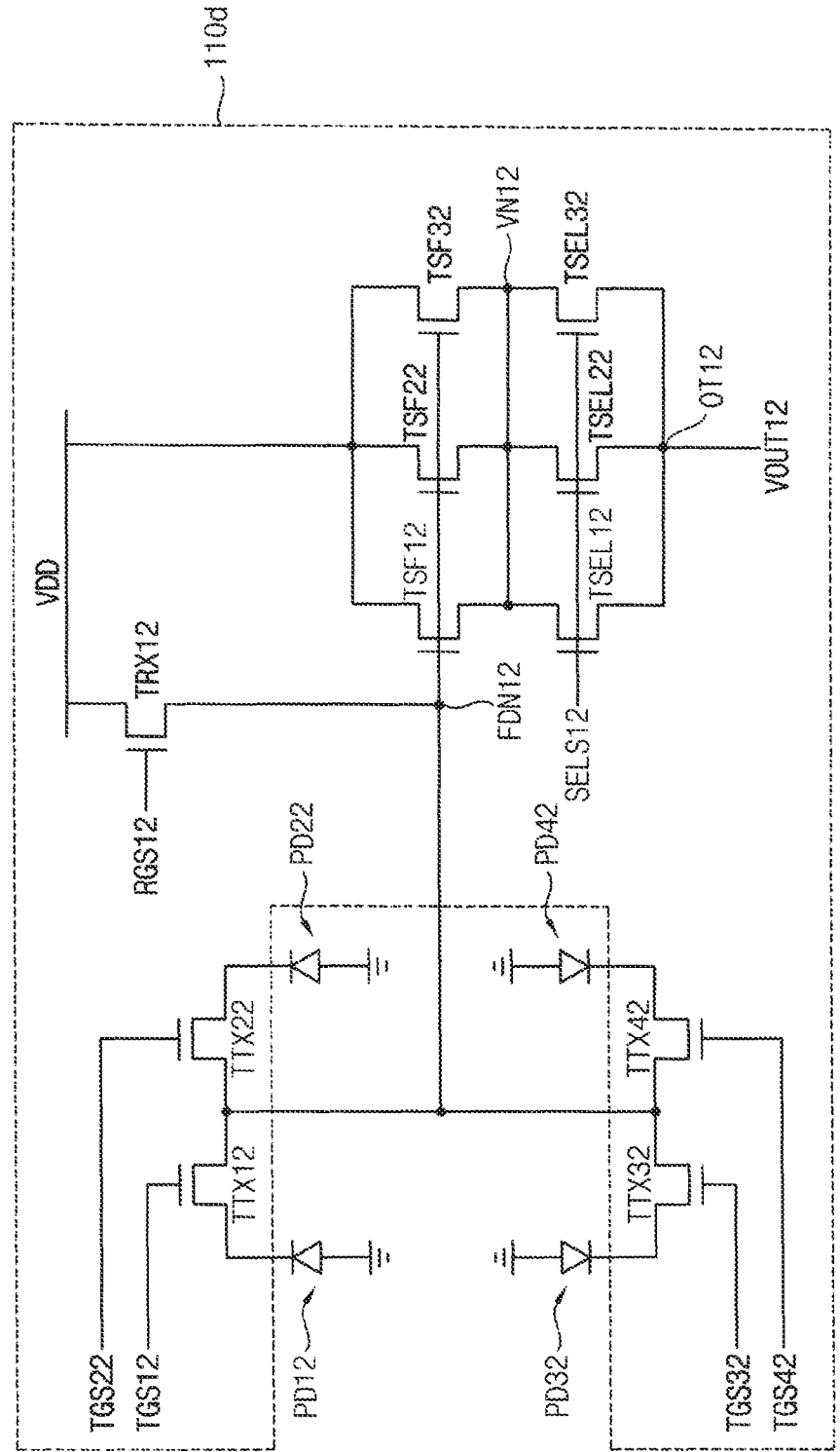
FIGS. 8 and 9 are circuit diagrams illustrating the pixel group of FIG. 1B according to exemplary embodiments of the inventive concept.
Figure 9:
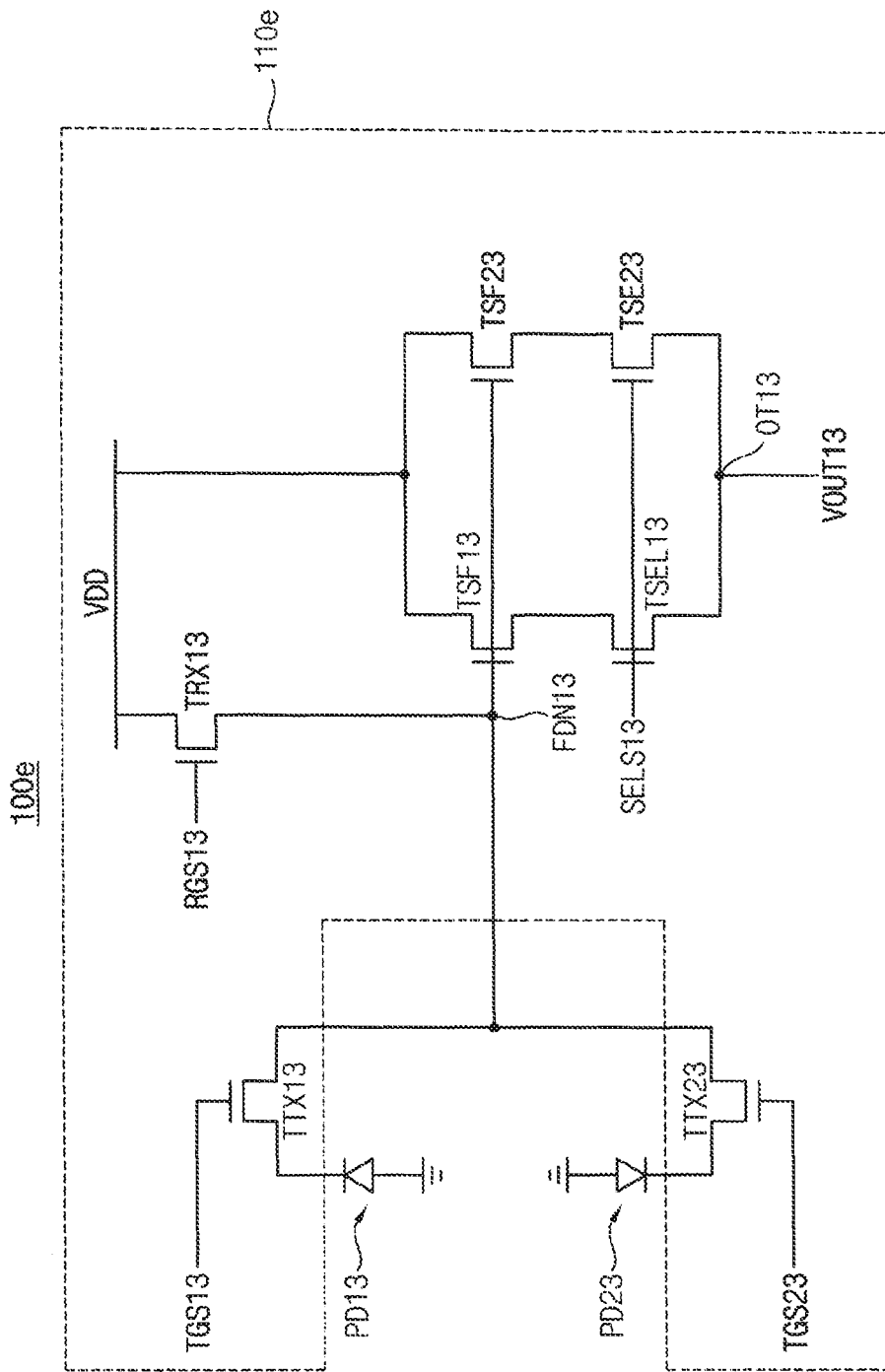

FIGS. 8 and 9 are circuit diagrams illustrating the pixel group of FIG. 1B according to exemplary embodiments of the inventive concept. Repeat descriptions are omitted.

Referring to FIG. 8, a first pixel group 100d that is included in a pixel array of an image sensor includes first, second, third, and fourth unit pixels. The first, second, third, and fourth unit pixels include first, second, third, and fourth photoelectric conversion units PD12, PD22, PD32, and PD42, and a first signal generation unit 110d shared by the first, second, third, and fourth photoelectric conversion units PD12, PD22, PD32, and PD42.

The first pixel group 100d of FIG. 8 may be substantially the same as the first pixel group 100c of FIG. 5, except that first, second, and third driving transistors TSF12, TSF22, and TSF32 in FIG. 8 and first, second, and third selection transistors TSEL12, TSEL22, and TSEL32 in FIG. 8 are connected in common to a node VN12. Thus, repeat descriptions will be omitted.

In FIG. 5, a first transistor group including the transistors TSF12 and TSEL12, a second transistor group including the transistors TSF22 and TSEL22, and a third transistor group including the transistors TSF32 and TSEL32 may be connected in parallel between the power supply voltage VDD and the first output terminal OT12. However, in FIG. 8, the first, second, and third driving transistors TSF12, TSF22, and TSF32 may be connected in parallel between the power supply voltage VDD and the node VN12, and the first, second, and third selection transistors TSEL12, TSEL22, and TSEL32 may be connected in parallel between the node VN12 and the first output terminal OT12.

Referring to FIG. 9, a first pixel group 100e that is included in a pixel array of an image sensor includes first and second unit pixels. The first and second unit pixels include first and second photoelectric conversion units PD13 and PD23, and a first signal generation unit 110e shared by the first and second photoelectric conversion units PD13 and PD23.

The first signal generation unit 110e includes first and second transfer transistors TTX13 and TTX23, a first floating diffusion node FDN13, first and second driving transistors TSF13 and TSF23, and first and second selection transistors TSEL13 and TSEL23. The first and second transfer transistors TTX13 and TTX23 are connected to the first and second photoelectric conversion units PD13 and PD23, respectively, and receive first and second transfer signals TGS13 and TGS23, respectively. The first floating diffusion node FDN13 is connected to the first and second transfer transistors TTX13 and TTX23. The first and second driving transistors TSF13 and TSF23 are connected to the first floating diffusion node FDN13, and are connected in parallel with each other. The first and second selection transistors TSEL13 and TSEL23 are connected in parallel between a first output terminal OT13 and the first and second driving transistors TSF13 and TSF23. The first signal generation unit 110e may further include a first reset transistor TRX13 connected to the first floating diffusion node FDN13.

The first and second driving transistors TSF13 and TSF23 may be connected in parallel with each other, and gate electrodes of the first and second driving transistors TSF13 and TSF23 may be connected in common to the first floating diffusion node FDN13. The first and second selection transistors TSEL13 and TSEL23 may be connected in parallel with each other, and gate electrodes of the first and second selection transistors TSEL13 and TSEL23 may receive a selection signal SELS13 in common. A gate electrode of the first reset transistor TRX13 may receive a reset signal RGS13. A plurality of pixel signals VOUT13 output from the first output terminal OT13 may include first and second pixel signals that correspond to first and second photo charges collected by the first and second photoelectric conversion units PD13 and PD23, respectively.

The first pixel group 100e of FIG. 9 may be an example of the pixel group 100 of FIG. 1B, where N is 2 and M is 2.

Figure 10:
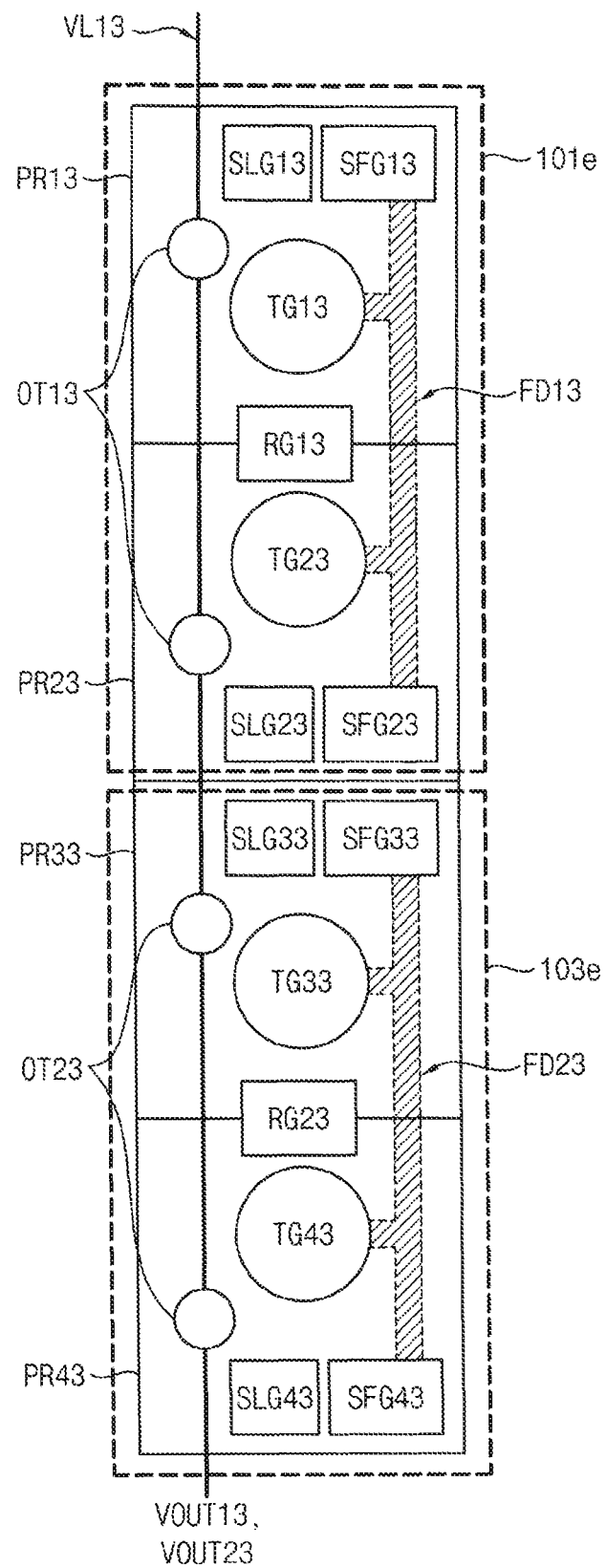
FIG. 10 is a plan view illustrating a layout arrangement of the pixel group of FIG. 9 according to an exemplary embodiment of the inventive concept.

FIG. 10 is a plan view illustrating a layout arrangement of the pixel group of FIG. 9 according to an exemplary embodiment of the inventive concept. FIG. 10 illustrates a top plan view of a substrate in which transistors included in a signal generation unit are in view of a first surface (e.g., a top surface) of the substrate. Repeat descriptions are omitted.

Referring to FIG. 10, a pixel array in an image sensor includes a first pixel group 101e and a second pixel group 103e adjacent to the first pixel group 101e.

The first pixel group 101e includes first and second unit pixels. The first and second unit pixels in the first pixel group 101e may be substantially the same as the first and second unit pixels in the first pixel group 100e of FIG. 9, respectively. The first and second unit pixels in the first pixel group 101e may be arranged in a 2×1 (or 1×2) matrix formation in a plan view.

For example, the first and second unit pixels in the first pixel group 101e may be formed in first and second pixel regions PR13 and PR23, respectively, arranged in a 2×1 matrix formation in a plan view. First and second transfer gates TG13 and TG23, which correspond to the first and second transfer transistors TTX13 and TTX23 in FIG. 9, may be formed on the first and second pixel regions PR13 and PR23, respectively. A first floating diffusion region FD13, which corresponds to the first floating diffusion node FDN13 in FIG. 9, may be formed in the first and second pixel regions PR13 and PR23 such that the first floating diffusion region FD13 partially overlaps all of the first and second pixel regions PR13 and PR23.

Each of first and second driving gates SFG13 and SFG23, which correspond to the first and second driving transistors TSF13 and TSF23 in FIG. 9, may be formed on a respective one of the first and second pixel regions PR13 and PR23. Each of first and second selection gates SLG13 and SLG23, which correspond to the first and second selection transistors TSEL13 and TSEL23 in FIG. 9, may be formed on a respective one of the first and second pixel regions PR13 and PR23, and may be disposed adjacent to a respective one of the first and second driving gates SFG13 and SFG23. A first reset gate RG13, which corresponds to the first reset transistor TRX13 in FIG. 9, may be formed on the first and second pixel regions PR13 and PR23 such that the first reset gate RG13 partially overlaps the first and second pixel regions PR13 and PR23. As illustrated in FIG. 10, arrangements of the transfer gates TG13 and TG23 may be determined first, and arrangements of the other gates SFG13, SFG23, SLG13, SLG23, and RG13 may be determined to efficiently utilize the remaining areas of the pixel regions PR13 and PR23.

First and second photoelectric conversion regions, which correspond to the first and second photoelectric conversion units PD13 and PD23 in FIG. 9, may be formed in the first and second pixel regions PR13 and PR23, respectively.

In exemplary embodiments of the inventive concept, the first and second driving gates SFG13 and SFG23, corresponding to the first and second driving transistors TSF13 and TSF23 in FIG. 9, and the first and second selection gates SLG13 and SLG23, corresponding to the first and second selection transistors TSEL13 and TSEL23 in FIG. 9, may be disposed as illustrated in FIG. 10, such that an output line VL13 connected to the first output terminal OT13 is formed in a straight line in a plan view.

The second pixel group 103e may include third, and fourth unit pixels, and may have a structure substantially the same as that of the first pixel group 101e.

For example, the third and fourth unit pixels in the second pixel group 103e may include third and fourth photoelectric conversion units and a second signal generation unit shared by the third and fourth photoelectric conversion units. The third and fourth unit pixels may be arranged in a 2×1 matrix formation in a plan view. The second signal generation unit may include third and fourth transfer transistors, a second floating diffusion node, third and fourth driving transistors, and third and fourth selection transistors. The third and fourth transfer transistors may be connected to the third and fourth photoelectric conversion units, respectively. The second floating diffusion node may be connected to the third and fourth transfer transistors. The third and fourth driving transistors may be connected to the second floating diffusion node, and may be connected in parallel with each other. The third and fourth selection transistors may be connected in parallel between a second output terminal OT23 and the third and fourth driving transistors. The second output terminal OT23 may be different from the first output terminal OT13. The second signal generation unit may further include a second reset transistor that is connected to the second floating diffusion node.

The third and fourth unit pixels in the second pixel group 103e may be formed in third and fourth pixel regions PR33 and PR43, respectively, arranged in a 2×1 matrix formation in a plan view. Arrangements of third and fourth transfer gates TG33 and TG43 corresponding to the third and fourth transfer transistors, a second floating diffusion region FD23 corresponding to the second floating diffusion node, third and fourth driving gates SFG33 and SFG43 corresponding to the third and fourth driving transistors, third and fourth selection transistors SLG33 and SLG43 corresponding to the third and fourth selection transistors, and a second reset gate RG23 corresponding to the second reset transistor may be substantially the same as arrangements of the first and second transfer gates TG13 and TG23, the first floating diffusion region FD13, the first and second driving gates SFG13 and SFG23, the first and second selection gates SLG11 and SLG21, and the first reset gate RG13, respectively. Third and fourth photoelectric conversion regions corresponding to the third and fourth photoelectric conversion units may be formed in the third and fourth pixel regions PR33 and PR43, respectively.

In exemplary embodiments of the inventive concept, the first, second, third, and fourth driving gates SFG13, SFG23, SFG33, and SFG43, corresponding to the first, second, third, and fourth driving transistors, and the first, second, third, and fourth selection gates SLG13, SLG23, SLG33, and SLG43, corresponding to the first, second, third, and fourth selection transistors, may be disposed as illustrated in FIG. 10, such that the output line VL13 connected to the first and second output terminals OT13 and OT23 is formed in a straight line in a plan view. The pixel signals VOUT13 may be output from the first and second unit pixels via the first output terminal OT13 and the output line VL13, and pixel signals VOUT23 may be output from the third and fourth unit pixels via the second output terminal OT23 and the output line VL13.

Figure 11:
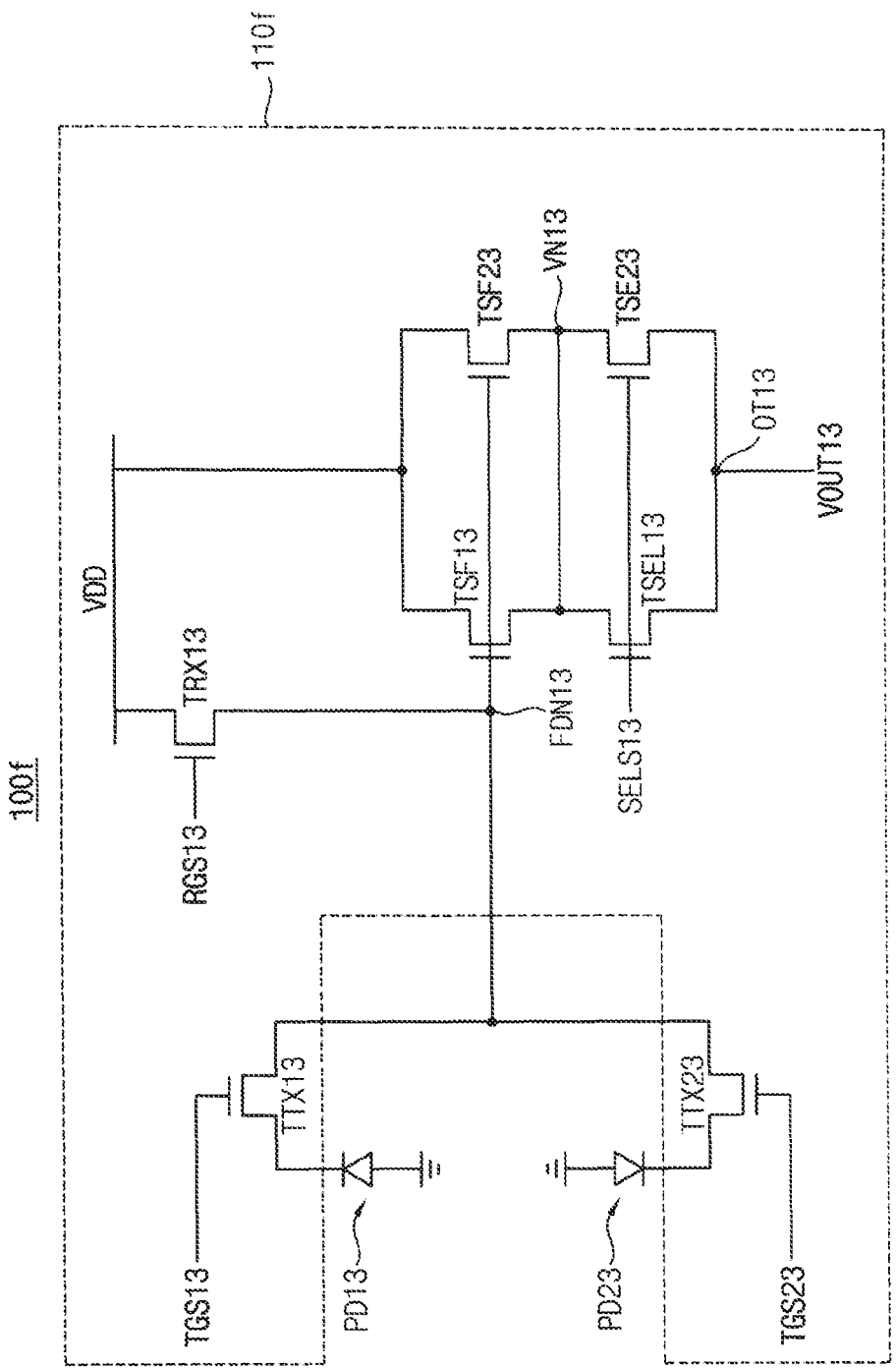
FIG. 11 is a circuit diagram illustrating the pixel group of FIG. 1B according to an exemplary embodiment of the inventive concept.

FIG. 11 is a circuit diagram illustrating the pixel group of FIG. 1B according to an exemplary embodiment of the inventive concept. Repeat descriptions are omitted.

Referring to FIG. 11, a first pixel group 100f that is included in a pixel array of an image sensor includes first and second unit pixels. The first and second unit pixels include first and second photoelectric conversion units PD13 and PD23, and a first signal generation unit 110f shared by the first and second photoelectric conversion units PD13 and PD23.

The first pixel group 100f of FIG. 11 may be substantially the same as the first pixel group 100e of FIG. 9, except that first and second driving transistors TSF13 and TSF23 in FIG. 11 and first and second selection transistors TSEL13 and TSEL23 in FIG. 11 are connected in common to a node VN13. Thus, repeat descriptions will be omitted.

In FIG. 9, a first transistor group including the transistors TSF13 and TSEL13 and a second transistor group including the transistors TSF23 and TSEL23 may be connected in parallel between the power supply voltage VDD and the first output terminal OT13. However, in FIG. 11, the first and second driving transistors TSF13 and TSF23 may be connected in parallel between the power supply voltage VDD and the node VN13, and the first and second selection transistors TSEL13 and TSEL23 may be connected in parallel between the node VN13 and the first output terminal OT13.

Although the above-described exemplary embodiments of the inventive concept include a specific number of photoelectric conversion units, driving transistors, and selection transistors, the inventive concept is not limited thereto. For example, the inventive concept may be applied to any pixel structure in which one signal generation unit is shared by any number of photoelectric conversion units and the one signal generation unit includes any number of driving transistors connected in parallel with one another and any number of selection transistors connected in parallel with one another.

Figure 12:
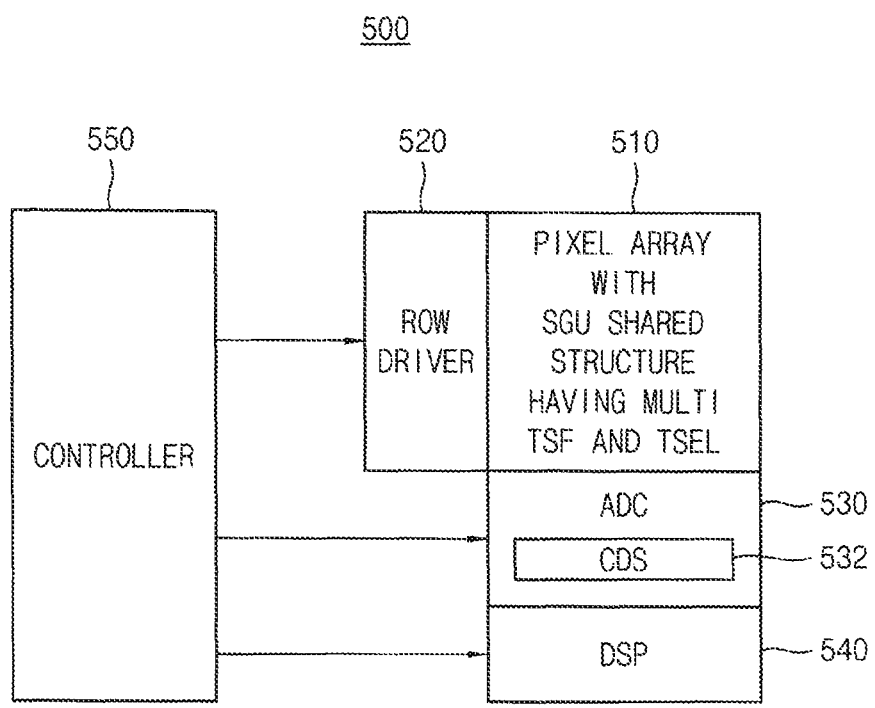
FIG. 12 is a block diagram illustrating an image sensor according to an exemplary embodiment of the inventive concept.

FIG. 12 is a block diagram illustrating an image sensor according to an exemplary embodiment of the inventive concept.

Referring to FIG. 12, an image sensor 500 includes a pixel array 510 and a signal processing unit. The signal processing unit may include a row driver 520, an analog-to-digital converting (ADC) unit 530, a digital signal processing (DSP) unit 540, and a controller 550.

The pixel array 510 generates a plurality of pixel signals (e.g., analog pixel signals) based on incident light. The pixel array 510 includes a plurality of unit pixels that are arranged in a matrix of a plurality of rows and a plurality of columns.

The pixel array 510 may correspond to the pixel array 10 of FIG. 1A and may be implemented with the examples described above with reference to FIGS. 1B through 11. For example, the pixel array 510 may be implemented with the SGU shared structure in which one signal generation unit is shared by a plurality of photoelectric conversion units, and the one signal generation unit may include a plurality of driving transistors connected in parallel with one another and a plurality of selection transistors connected in parallel with one another. By including the plurality of driving transistors connected in parallel with one another and the plurality of selection transistors connected in parallel with one another, noise may be reduced, and an operating speed of the unit pixel may increase. Further, one driving transistor and one selection transistor may be connected to each other by one line or wiring (e.g., with a relatively simple structure), and thus degradation due to FPN may be prevented.

The signal processing unit generates image data (e.g., effective digital image data) based on the plurality of pixel signals.

The row driver 520 may be connected with each row of the pixel array 510. The row driver 520 may generate driving signals to drive each row. For example, the row driver 520 may drive the plurality of unit pixels included in the pixel array 510 row by row.

The ADC unit 530 may be connected with each column of the pixel array 510. The ADC unit 530 may convert analog signals (e.g., the pixel signals) output from the pixel array 510 into digital signals (e.g., the image data). In exemplary embodiments of the inventive concept, the ADC unit 530 may perform a column analog-to-digital conversion that converts the analog signals in parallel (e.g., simultaneously or concurrently) using a plurality of analog-to-digital converters respectively coupled to the plurality of columns. In exemplary embodiments of the inventive concept, the ADC unit 530 may perform a single analog-to-digital conversion that sequentially converts the analog signals using a single analog-to-digital converter.

According to an exemplary embodiment of the inventive concept, the ADC unit 530 may further include a correlated double sampling (CDS) unit 532 for extracting an effective signal component. In exemplary embodiments of the inventive concept, the CDS unit 532 may perform an analog double sampling that extracts the effective signal component based on a difference between an analog reset signal including a reset component and an analog data signal including a signal component. In exemplary embodiments of the inventive concept, the CDS unit 532 may perform a digital double sampling that converts the analog reset signal and the analog data signal into two digital signals and extracts the effective signal component based on a difference between the two digital signals. In exemplary embodiments of the inventive concept, the CDS unit 532 may perform a dual correlated double sampling that performs both the analog double sampling and the digital double sampling.

The DSP unit 540 may receive the digital signals output from the ADC unit 530, and may perform an image data processing on the digital signals. For example, the DSP unit 540 may perform image interpolation, color correction, white balance, gamma correction, color conversion, etc.

The controller 550 may control the row driver 520, the ADC unit 530, and the DSP unit 540 by providing control signals, such as a clock signal, a timing control signal, or the like. According to an exemplary embodiment of the inventive concept, the controller 550 may include a control logic circuit, a phase locked loop circuit, a timing control circuit, a communication interface circuit, or the like.

Figure 13:
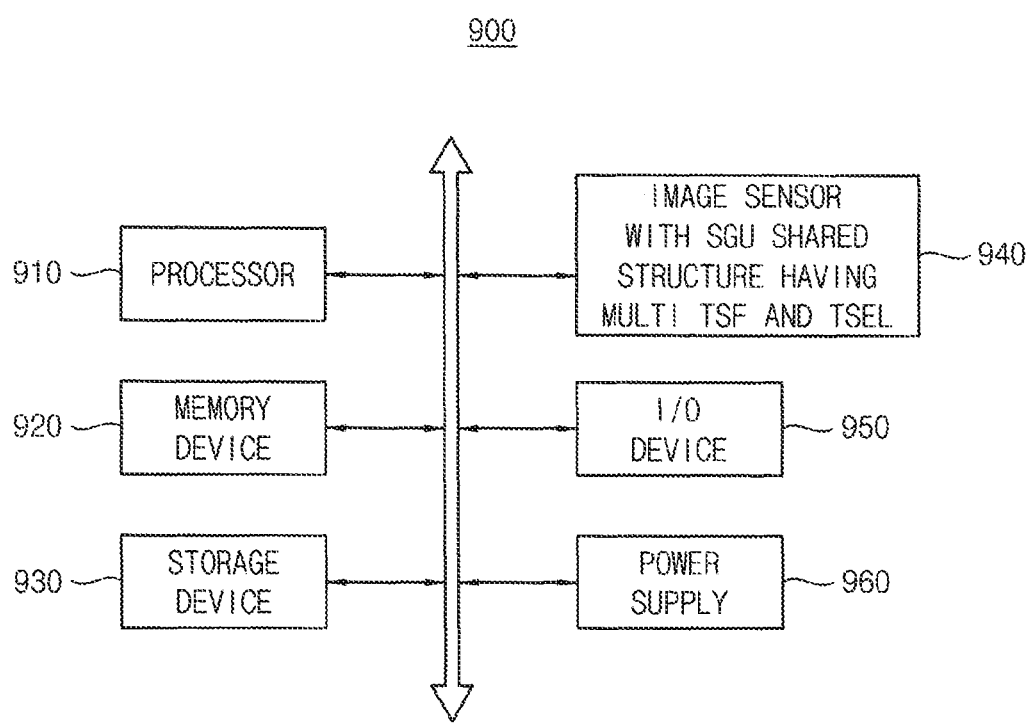
FIG. 13 is a block diagram illustrating a computing system including an image sensor according to an exemplary embodiment of the inventive concept.

FIG. 13 is a block diagram illustrating a computing system including an image sensor according to an exemplary embodiment of the inventive concept.

Referring to FIG. 13, a computing system 900 may include a processor 910, a memory device 920, a storage device 930, an image sensor 940, an input/output (I/O) device 950, and a power supply 960.

The processor 910 may perform various calculations or tasks for operating the computing system 900. For example, the processor 910 may include a microprocessor, a central processing unit (CPU), an application processor (AP), etc. The memory device 920 and the storage device 930 may store data for operating the computing system 900. For example, the memory device 920 may include a volatile memory device and/or a nonvolatile memory device, and the storage device 930 may include a solid state drive (SSD), a hard disk drive (HDD), a CD-ROM, etc. The I/O device 950 may include an input device (e.g., a keyboard, a keypad, a mouse, etc.) and an output device (e.g., a printer, a display device, etc.). The power supply 960 may supply operation voltages for the computing system 900.

The image sensor 940 may include a pixel array according to exemplary embodiments of the inventive concept. For example, the pixel array in the image sensor 940 may be implemented with a shared pixel structure (e.g., the SGU shared structure), and may include a plurality of driving/selection transistors connected in parallel with one another. Accordingly, noise may be reduced, an operating speed of the unit pixel may increase, and degradation due to FPN may be prevented.

The inventive concept may be applied to various devices and systems that include an image sensor. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

As described above, the pixel array and the image sensor according to exemplary embodiments of the inventive concept may be implemented with a signal generation unit shared structure (SGU) in which one signal generation unit is shared by the plurality of photoelectric conversion units. In addition, the signal generation unit may be implemented with a multi driving transistor (TSF) and selection transistor (TSEL) structure in which the signal generation unit includes the plurality of driving transistors connected in parallel with one another and the plurality of selection transistors connected in parallel with one another.

By including the plurality of driving transistors connected in parallel with one another, a total area of the driving transistors may increase, a total gain of the driving transistors may increase, and a total resistance of the driving transistors may decrease. Thus, dark random noise, random telescopic signal (RTS) noise, thermal noise, etc. may be reduced, and an operating speed of the unit pixel may increase. In addition, by including the plurality of selection transistors connected in parallel with one another, a total area of the selection transistors may increase and a total resistance of the selection transistors may decrease. Further, one driving transistor and one selection transistor may be connected to each other by one line or wiring (e.g., with a relatively simple structure), and thus, degradation due to fixed pattern noise (FPN) may be prevented.

While the inventive concept has been shown and described with reference to exemplary embodiments thereof, it will be understood by those of ordinary skill in the art that various changes in form and details may be made thereto without departing from the spirit and scope of the present inventive concept as set forth by the following claims.

What is claimed is:

1. A pixel array included in an image sensor, the pixel array comprising:
    a first pixel group comprising:
        first, second, third, and fourth unit pixels including first, second, third, and fourth photoelectric conversion units, respectively, and a first signal generation unit shared by the first, second, third, and fourth photoelectric conversion units,
    wherein the first signal generation unit includes:
        first, second, third, and fourth transfer transistors connected to the first, second, third, and fourth photoelectric conversion units, respectively;
        a first floating diffusion node connected to the first, second, third, and fourth transfer transistors;
        a plurality of driving transistors connected to the first floating diffusion node and connected in parallel with one another; and
        a plurality of selection transistors connected in parallel between a first output terminal and the plurality of driving transistors,
    wherein the first output terminal outputs first, second, third, and fourth pixel signals that correspond to first, second, third, and fourth photo charges, respectively, collected by the first, second, third, and fourth photoelectric conversion units, respectively, and
    wherein a number of the plurality of selection transistors is equal to a number of the plurality of driving transistors.

2. The pixel array of claim 1, wherein the number of the plurality of driving transistors and the number of the plurality of selection transistors in the first signal generation unit are less than a number of unit pixels in the first pixel group.

3. The pixel array of claim 1, wherein:
    the first, second, third, and fourth unit pixels are arranged in a 2×2 matrix formation,
    the plurality of driving transistors include first and second driving transistors connected in parallel with each other,
    gate electrodes of the first and second driving transistors are connected in common to the first floating diffusion node,
    the plurality of selection transistors include first and second selection transistors connected in parallel with each other, and
    gate electrodes of the first and second selection transistors receive a selection signal in common.

4. The pixel array of claim 3, wherein the first and second driving transistors and the first and second selection transistors are disposed such that an output line connected to the first output terminal is formed in a straight line in a plan view.

5. The pixel array of claim 3, further comprising:
    a second pixel group adjacent to the first pixel group, the second pixel group comprising:
        fifth, sixth, seventh, and eighth unit pixels including fifth, sixth, seventh, and eighth photoelectric conversion units, respectively, and a second signal generation unit shared by the fifth, sixth, seventh, and eighth photoelectric conversion units, wherein the fifth, sixth, seventh, and eighth unit pixels are arranged in a 2×2 matrix formation, wherein the second signal generation unit includes:
fifth, sixth, seventh, and eighth transfer transistors connected to the fifth, sixth, seventh, and eighth photoelectric conversion units, respectively;
a second floating diffusion node connected to the fifth, sixth, seventh, and eighth transfer transistors;
third and fourth driving transistors connected to the second floating diffusion node and connected in parallel with each other; and
third and fourth selection transistors connected in parallel between a second output terminal and the third and fourth driving transistors, wherein the second output terminal is different from the first output terminal.

6. The pixel array of claim 5, wherein the first, second, third, and fourth driving transistors and the first, second, third, and fourth selection transistors are disposed such that an output line connected to the first and second output terminals is formed in a straight line in a plan view.

7. The pixel array of claim 1, wherein:
the first, second, third, and fourth unit pixels are arranged in a 4×1 matrix formation,
the plurality of driving transistors include first, second, and third driving transistors connected in parallel with one another,
gate electrodes of the first, second, and third driving transistors are connected in common to the first floating diffusion node,
the plurality of selection transistors include first, second, and third selection transistors connected in parallel with one another, and
gate electrodes of the first, second, and third selection transistors receive a selection signal in common.

8. The pixel array of claim 7, wherein the first, second, and third driving transistors and the first, second, and third selection transistors are disposed such that an output line connected to the first output terminal is formed in a straight line in a plan view.

9. The pixel array of claim 1, wherein:
the first, second, third, and fourth unit pixels are arranged in a 2×2 matrix formation,
the plurality of driving transistors include first, second, and third driving transistors connected in parallel with one another,
gate electrodes of the first, second, and third driving transistors are connected in common to the first floating diffusion node,
the plurality of selection transistors include first, second, and third selection transistors connected in parallel with one another, and
gate electrodes of the first, second, and third selection transistors receive a selection signal in common.

10. The pixel array of claim 9, further comprising:
a second pixel group adjacent to the first pixel group, the second pixel group comprising:
fifth, sixth, seventh, and eighth unit pixels including fifth, sixth, seventh, and eighth photoelectric conversion units, respectively, and a second signal generation unit shared by the fifth, sixth, seventh, and eighth photoelectric conversion units, wherein the fifth, sixth, seventh, and eighth unit pixels are arranged in a 2×2 matrix formation,
wherein the second signal generation unit includes:
fifth, sixth, seventh, and eighth transfer transistors connected to the fifth, sixth, seventh, and eighth photoelectric conversion units, respectively;
a second floating diffusion node connected to the fifth, sixth, seventh, and eighth transfer transistors;
fourth, fifth, and sixth driving transistors connected to the second floating diffusion node and connected in parallel with one another; and
fourth, fifth, and sixth selection transistors connected in parallel between a second output terminal and the fourth, fifth, and sixth driving transistors, wherein the second output terminal is different from the first output terminal.

11. The pixel array of claim 10, wherein the first, second, third, fourth, fifth, and sixth driving transistors and the first, second, third, fourth, fifth, and sixth selection transistors are disposed such that each of a first output line connected to the first output terminal and a second output line connected to the second output terminal is formed in a straight line in a plan view.

12. The pixel array of claim 11, further comprising:
a switch configured to select one of the first output line and the second output line.

13. The pixel array of claim 11, wherein the first pixel group and the second pixel group are formed with a mirror structure in which the first pixel group and the second pixel group are symmetric with respect to an imaginary line between the first pixel group and the second pixel group.

14. The pixel array of claim 11, wherein the first output line and the second output line are parallel with each other.

15. The pixel array of claim 1, wherein the first signal generation unit further includes:
a first reset transistor connected to the first floating diffusion node.

16. A pixel array included in an image sensor, the pixel array comprising:
a first pixel group comprising:
first and second unit pixels including first and second photoelectric conversion units, respectively, and a first signal generation unit shared by the first and second photoelectric conversion units,
wherein the first signal generation unit includes:
first and second transfer transistors connected to the first and second photoelectric conversion units, respectively;
a first floating diffusion node connected to the first and second transfer transistors;
a plurality of driving transistors connected to the first floating diffusion node and connected in parallel with one another; and
a plurality of selection transistors connected in parallel between a first output terminal and the plurality of driving transistors,
wherein the first output terminal outputs first and second pixel signals that correspond to first and second photo charges, respectively, collected by the first and second photoelectric conversion units, respectively, and
wherein a number of the plurality of selection transistors is equal to a number of the plurality of driving transistors.

17. The pixel array of claim 16, wherein the number of the plurality of driving transistors and the number of the plurality of selection transistors in the first signal generation unit are each equal to a number of unit pixels in the first pixel group.

18. The pixel array of claim 16, wherein:
the first and second unit pixels are arranged in a 2×1 matrix formation,
the plurality of driving transistors include first and second driving transistors connected in parallel with each other,
gate electrodes of the first and second driving transistors are connected in common to the first floating diffusion node,
the plurality of selection transistors include first and second selection transistors connected in parallel with each other, and
gate electrodes of the first and second selection transistors receive a selection signal in common.

19. The pixel array of claim 18, wherein the first and second driving transistors and the first and second selection transistors are disposed such that an output line connected to the first output terminal is formed in a straight line in a plan view.

20. An image sensor comprising:
a pixel array configured to generate a plurality of pixel signals in response to incident light; and
a signal processing unit configured to generate image data in response to the plurality of pixel signals,
wherein the pixel array includes:
a first pixel group comprising:
a plurality of unit pixels including a plurality of photoelectric conversion units and a first signal generation unit shared by the plurality of photoelectric conversion units,
wherein the first signal generation unit includes:
a plurality of transfer transistors connected to the plurality of photoelectric conversion units, respectively;
a first floating diffusion node connected to the plurality of transfer transistors;
a plurality of driving transistors connected to the first floating diffusion node and connected in parallel with one another; and
a plurality of selection transistors connected in parallel between a first output terminal and the plurality of driving transistors,
wherein the first output terminal outputs at least one of the plurality of pixel signals, and
wherein a number of the plurality of selection transistors is equal to a number of the plurality of driving transistors.

* * * * *